(12) United States Patent
Yamada et al.

(10) Patent No.: US 10,763,332 B2
(45) Date of Patent: Sep. 1, 2020

(54) SEMICONDUCTOR WAFER AND METHOD OF INSPECTING SEMICONDUCTOR WAFER

(71) Applicant: SUMITOMO CHEMICAL COMPANY, LIMITED, Tokyo (JP)

(72) Inventors: Hisashi Yamada, Ibaraki (JP); Taiki Yamamoto, Ibaraki (JP); Kenji Kasahara, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 14 days.

(21) Appl. No.: 15/586,526

(22) Filed: May 4, 2017

(65) Prior Publication Data
US 2017/0236906 A1 Aug. 17, 2017

Related U.S. Application Data

(63) Continuation of application No. PCT/JP2015/081411, filed on Nov. 6, 2015.

(30) Foreign Application Priority Data

Nov. 7, 2014 (JP) .................................. 2014-227593
Nov. 7, 2014 (JP) .................................. 2014-227594
(Continued)

(51) Int. Cl.
*H01L 29/20* (2006.01)
*H01L 23/00* (2006.01)
(Continued)

(52) U.S. Cl.
CPC ... *H01L 29/2003* (2013.01); *G01N 23/20008* (2013.01); *H01L 21/0254* (2013.01);
(Continued)

(58) Field of Classification Search
CPC ............. H01L 29/2003; H01L 29/7787; H01L 23/562; H01L 23/20008
See application file for complete search history.

(56) References Cited

U.S. PATENT DOCUMENTS 9,053,931 B2   6/2015   Yoshida et al.
9,831,310 B2   11/2017  Kotani et al.
(Continued)

FOREIGN PATENT DOCUMENTS

CN   102460664 A   5/2012
CN   103545361 A   1/2014
(Continued)

OTHER PUBLICATIONS

International Preliminary Report on Patentability with translation of Written Opinion issued from the International Bureau in counterpart International Application No. PCT/JP2015/081411, dated May 18, 2017.

(Continued)

*Primary Examiner* — Peniel M Gumedzoe
(74) *Attorney, Agent, or Firm* — Sughrue Mion, PLLC

(57) ABSTRACT

Provided is a semiconductor wafer in which a nitride crystal layer on a silicon wafer includes a reaction suppressing layer to suppress reaction between a silicon atom and a Group-III atom, a stress generating layer to generate compressive stress and an active layer in which an electronic element is to be formed, the reaction suppressing layer, the stress generating layer and the active layer are arranged in an order of the reaction suppressing layer, the stress generating layer and the active layer with the reaction suppressing layer being positioned the closest to the silicon wafer, and the stress generating layer includes a first crystal layer having a bulk crystal lattice constant of al and a second crystal layer in contact with a surface of the first crystal layer that faces (Continued)

the active layer, where the second crystal layer has a bulk crystal lattice constant of a2 (a1<a2).

15 Claims, 18 Drawing Sheets

(30) Foreign Application Priority Data

Nov. 7, 2014 (JP) .................................. 2014-227595
Nov. 7, 2014 (JP) .................................. 2014-227596

(51) Int. Cl.
*G01N 23/20* (2018.01)
*H01L 21/02* (2006.01)
*G01N 23/20008* (2018.01)
*H01L 29/778* (2006.01)

(52) U.S. Cl.
CPC .. *H01L 21/02381* (2013.01); *H01L 21/02458* (2013.01); *H01L 21/02505* (2013.01); *H01L 23/562* (2013.01); *G01N 2223/6116* (2013.01); *H01L 21/02579* (2013.01); *H01L 29/7787* (2013.01)

(56) References Cited

U.S. PATENT DOCUMENTS

| | | | | |
|---|---|---|---|---|
| 2002/0079502 A1* | 6/2002 | Ishibashi | ................ | B82Y 20/00 257/89 |
| 2004/0195562 A1* | 10/2004 | Munns | .................. | H01L 29/155 257/1 |
| 2006/0243988 A1 | 11/2006 | Narukawa et al. | | |
| 2007/0164306 A1 | 7/2007 | Nakahata et al. | | |
| 2010/0207138 A1 | 8/2010 | Nakahata et al. | | |
| 2011/0062556 A1* | 3/2011 | Komiyama | ....... | H01L 21/02458 257/615 |
| 2012/0091435 A1* | 4/2012 | Ikuta | .................... | H01L 29/1075 257/22 |
| 2013/0307023 A1* | 11/2013 | Kokawa | .................. | H01L 29/36 257/190 |
| 2014/0015608 A1* | 1/2014 | Kotani | ................ | H01L 29/2003 330/277 |
| 2014/0061693 A1 | 3/2014 | Yoshida et al. | | |
| 2014/0209862 A1* | 7/2014 | Ikuta | ................. | H01L 29/66462 257/22 |
| 2015/0090957 A1* | 4/2015 | Tomabechi | ....... | H01L 29/66462 257/20 |
| 2015/0221502 A1 | 8/2015 | Mino et al. | | |

FOREIGN PATENT DOCUMENTS

| | | |
|---|---|---|
| CN | 103682009 A | 3/2014 |
| CN | 103782375 A | 5/2014 |
| JP | 2008-171843 A | 7/2008 |
| JP | 2010-232322 A | 10/2010 |
| JP | 2013-21124 A | 1/2013 |
| JP | 2013-69939 A | 4/2013 |
| JP | 2013-145782 A | 7/2013 |
| JP | 2014-17422 A | 1/2014 |
| JP | 2014-53385 A | 3/2014 |
| TW | 200610192 A | 3/2006 |
| TW | 200707803 A | 2/2007 |
| TW | 201411698 A | 3/2014 |
| TW | 201411699 A | 3/2014 |

OTHER PUBLICATIONS

Mihir Tungare, et al., "Modification of dislocation behavior in GaN overgrown on engineered AlN film-on-bulk Si substrate", Journal of Applied Physics, Apr. 30, 2013, pp. 163108-1-163108-5, vol. 113.
Y. Ohba., et al., "Growth of AlN on sapphire substrates by using a thin AlN buffer layer grown two-dimensionally at a very low V/III ratio", Journal of Crystal Growth, 2000, pp. 258-261, vol. 221.
G. Sarusi, et al., "Cathodoluminescence Study of Micro-crack-induced Stress Relief for AlN Films on Si(111)", Journal of Electronic Materials, 2006, pp. L15-L19, vol. 35, No. 12.
Koh Matsumoto, et al., "Present Status and Challenge of Metal Organic Vapor Phase Epitaxy Equipment for the Epitaxial Growth of GaN Power Electronic Devices on Silicon Substrate", J. Vac. Soc. Jpn., 2011, pp. 376-380, vol. 54, No. 6.
International Search Report for PCT/JP2015/081411 dated Feb. 16, 2016 [PCT/ISA/210].
Communication dated Aug. 29, 2019, from The State Intellectual Property Office of the P.R. of China in counterpart Application No. 201580059596.5.
Communication dated Apr. 8, 2019, issued by the Austria Patent Office in counterpart Austrian Application No. 3 A 9400/2015.
Communication dated May 14, 2019, issued by the Japan Patent Office in counterpart Japanese Application No. 2016-557840.
Machine Translation of JP 2008-171843 A, published Jul. 24, 2008 (reference submitted May 4, 2017).
Machine Translation of JP 2013-145782 A, published Jul. 25, 2013 (reference submitted May 4, 2017).
Communication dated Oct. 30, 2018, from Taiwanese Intellectual Property Office in counterpart application No. 104136661.
Communication dated Jun. 4, 2020, from the China National Intellectual Property Administration in Application No. 201580059596.5.

* cited by examiner

SEMICONDUCTOR WAFER AND METHOD OF INSPECTING SEMICONDUCTOR WAFER

CROSS REFERENCE TO RELATED APPLICATIONS

This application is a Continuation of International Application No. PCT/JP2015/081411, filed on Nov. 6, 2015, which claims priority from Japanese Patent Application Nos:
2014-227593 filed in JP on Nov. 7, 2014,
2014-227594 filed in JP on Nov. 7, 2014,
2014-227595 filed in JP on Nov. 7, 2014,
2014-227596 filed in JP on Nov. 7, 2014
the contents of all of which are incorporated herein by reference in their entirety.

BACKGROUND

1. Technical Field

The present invention relates to a semiconductor wafer and a method of inspecting a semiconductor wafer.

2. Related Art

Attempts have been made to develop techniques of growing Group-III nitride semiconductor crystals on Si wafers. For example, Japanese Patent Application Publication No. 2013-021124 discloses a Group-III nitride epitaxial wafer, which is provided for the purposes of reducing the cracks that may occur during the step of forming devices. The Group-III nitride epitaxial wafer includes a Si wafer, an initial layer that is in contact with the Si wafer, and a superlattice stack structure formed on the initial layer and including a plurality of stacks each of which sequentially includes a first layer made of AlGaN having an Al ratio of more than 0.5 and no more than 1 and a second layer made of AlGaN having an Al ratio of more than 0 and no more than 0.5 and is characterized in that the Al ratio of the second layer gradually decreases in a direction away from the substrate.

For example, Japanese Patent Application Publication No. 2010-232322 discloses a compound semiconductor wafer that has reduced cracks, crystal defects and warping in a nitride semiconductor layer and can achieve improved productivity. The compound semiconductor wafer includes a silicon monocrystalline wafer having a crystal plane orientation denoted as the (111) plane, a first buffer layer formed on the silicon monocrystalline wafer and made of monocrystalline $Al_xGa_{1-x}N$ (0<x≤1), a second buffer layer formed on the first buffer layer and including a plurality of first unit layers and a plurality of second unit layers that are alternately stacked, each first unit layer being made of monocrystalline $Al_yGa_{1-y}N$ (0≤y<0.1) and having a thickness of no less than 250 nm and no more than 350 nm, each second unit layer being made of monocrystalline $Al_zGa_{1-z}N$ (0.9<z≤1) and having a thickness of no less than 5.0 nm and no more than 20 nm, and a semiconductor element forming region formed on the second buffer layer and including one or more nitride-based semiconductor monocrystalline layers.

For example, Japanese Patent Application Publication No. 2008-171843 discloses a semiconductor electronic device that can achieve both reduced warping in the wafer and further reduced leakage currents. The semiconductor electronic device is a semiconductor electronic device including a compound semiconductor layer stacked on the wafer with a buffer layer placed therebetween. The buffer layer includes a compound layer in which a second layer is stacked on a first layer. The first layer is made of a nitride-based compound semiconductor having an Al ratio of 0.2 or lower and the second layer is made of a nitride-based compound semiconductor having an Al ratio of 0.8 or higher.

Y. Ohba. R. Sato, J. Crystal Growth 221, 258 (2000), G. Sarusi et al., J. Electron. Mater. 35, L15 (2006) and M. Tungare et al., J. Appl. Phys. 113, 163108 (2013) disclose techniques of forming an AlN layer on a Si wafer. Y. Ohba. R. Sato, J. Crystal Growth 221, 258 (2000), G. Sarusi et al., J. Electron. Mater. 35, L15 (2006) and M. Tungare et al., J. Appl. Phys. 113, 163108 (2013) disclose microscopic images of the front surface of the AlN layer formed on the Si wafer. The images show that many holes are formed in the AlN layer.

K. Matsumoto et al., J. Vac. Soc. Jpn. 54, 6 (2011), p 376-380 discloses as follows: "if it is possible to grow and alternately stack GaN and AlN on each other in such a manner that the AlN on the GaN is relaxed and the GaN on the AlN has compressive stress, it is expected that the GaN/AlN strained layer super-lattice (hereinafter, referred to as SLS) structure can be used to allow the entire film to have compressive stress. It also seems possible to add compressive stress by employing other combinations than the SLS structures, as long as any upper film has a larger lattice constant than its lower film in the combinations."

When a Group-III nitride semiconductor layer is formed on a Si wafer, the wafer may be warped and the Group-III nitride semiconductor layer may crack due to the difference in thermal expansion coefficient between Si and the Group-III nitride semiconductor crystal. To address this issue, as disclosed in the above-mentioned patent and non-patent documents, a layer in which internal compressive stress is generated (hereinafter, may be referred to as the stress generating layer) is formed in order to balance the generated compressive stress and the tensile stress generated in the nitride crystal layer due to the difference in thermal expansion coefficient. In this way, the semiconductor wafer is prevented from being warped when room temperature is restored, and the Group-III nitride semiconductor layer is prevented from cracking.

When used to reduce the warping of the semiconductor wafer, however, the stress generating layer is designed to reduce the warping of the semiconductor wafer that may be observed once the temperature of the wafer has changed back to room temperature. Therefore, the wafer is warped while the epitaxial growth is taking place, during which the temperature of the wafer is kept high. If the wafer is warped, it is difficult to equalize the micro-level growth conditions across the entire front surface of the wafer. Here, the micro-level growth conditions greatly affect the characteristics such as the crystal quality and the sheet resistance. Therefore, it is difficult to maintain uniform characteristics such as the crystal quality across the entire region in the wafer plane while, at the same time, reducing the warping of the wafer that may be observed at room temperature. In particular, when a large Si wafer having a diameter of 6 inches or the like is used, it becomes even more difficult to reduce the warpage of the wafer that may be observed once the temperature of the wafer has changed back to room temperature and, at the same time, to maintain uniform characteristics such as the crystal quality since the warpage of the wafer during the epitaxial growth is also larger.

When the Group-III nitride semiconductor layer is formed on the Si wafer, a reaction suppressing layer is positioned between the Si wafer and the stress generating layer in order to suppress the reaction between the Si atoms constituting the Si wafer and the Ga atoms included in the Group-III atoms. The inventors of the present invention, however, have acknowledged through experiments and their studies that the reaction suppressing layer is capable of suppressing the reaction between the Si atoms and the Ga atoms and also greatly affects how much the wafer is warped depending on the state of the interface between the Si wafer and the reaction suppressing layer. Accordingly, it is necessary to appropriately control the growth of the reaction suppressing layer in order to efficiently protect the front surface of the Si wafer and appropriately reduce the warping of the wafer.

The objective of the present invention is to provide a semiconductor wafer that is obtained by forming a Group-III nitride semiconductor layer using epitaxial growth on a Si wafer, where the Group-III nitride semiconductor layer can achieve satisfying characteristics such as the required withstand voltage, the physical properties such as the sheet resistance reliably achieve in-plane uniformity, and the semiconductor wafer is warped only a little. In particular, the objective of the present invention is to provide a semiconductor wafer that reliably achieve the required characteristics and the in-plane physical property uniformity and that is warped only a little as described above even when a large Si wafer having a diameter of 6 inches or more is used. Another objective of the present invention is to provide a semiconductor wafer that is capable of reliably achieving the required characteristics and the in-plane uniformity and reducing the warping as described above while the front surface of the Si wafer is efficiently protected.

SUMMARY

Therefore, it is an object of an aspect of the innovations herein to provide a semiconductor wafer and a method of inspecting a semiconductor wafer, which are capable of overcoming the above drawbacks accompanying the related art. The above and other objects can be achieved by combinations described in the claims. In order to solve the above-mentioned problems, a first aspect of the innovations herein provides a semiconductor wafer including a silicon wafer and a nitride crystal layer on the silicon wafer. Here, the nitride crystal layer includes a reaction suppressing layer configured to suppress reaction between a silicon atom and a Group-III atom, a stress generating layer configured to generate compressive stress and an active layer in which an electronic element is to be formed, the reaction suppressing layer, the stress generating layer and the active layer are arranged in an order of the reaction suppressing layer, the stress generating layer and the active layer with the reaction suppressing layer being positioned the closest to the silicon wafer, and the stress generating layer includes a first crystal layer having a bulk crystal lattice constant of a1, and a second crystal layer in contact with a surface of the first crystal layer that faces the active layer, where the second crystal layer has a bulk crystal lattice constant of a2 (a1<a2).

A second aspect of the innovations herein provides a method of inspecting a semiconductor wafer including a silicon wafer and a nitride crystal layer on the silicon wafer. Here, the nitride crystal layer includes a reaction suppressing layer configured to suppress reaction between a silicon atom and a Group-III atom, a stress generating layer configured to generate compressive stress and an active layer in which an electronic element is to be formed, and the reaction suppressing layer, the stress generating layer and the active layer are arranged in an order of the reaction suppressing layer, the stress generating layer and the active layer with the reaction suppressing layer being positioned the closest to the silicon wafer. Here, the inspection is judged to be successful if a Qx value of the reaction suppressing layer obtained by X-ray reciprocal space mapping on the nitride crystal layer falls within a range of more than −0.6427 and less than −0.63977.

A third aspect of the innovations herein provides a semiconductor wafer including a silicon wafer and a nitride crystal layer on the silicon wafer. Here, the nitride crystal layer includes a reaction suppressing layer configured to suppress reaction between a silicon atom and a Group-III atom, a stress generating layer configured to generate compressive stress and an active layer in which an electronic element is to be formed, the reaction suppressing layer, the stress generating layer and the active layer are arranged in an order of the reaction suppressing layer, the stress generating layer and the active layer with the reaction suppressing layer being positioned the closest to the silicon wafer, and the stress generating layer includes a first crystal layer having a bulk crystal lattice constant of a1 and a thickness of more than 5.0 nm and less than 20 nm, and a second crystal layer in contact with a surface of the first crystal layer that faces the active layer, where the second crystal layer has a bulk crystal lattice constant of a2 (a1<a2). The semiconductor wafer may further have additional features as in the above-described first aspect.

A fourth aspect of the innovations herein provides a semiconductor wafer including a silicon wafer and a nitride crystal layer on the silicon wafer. Here, the nitride crystal layer includes a reaction suppressing layer configured to suppress reaction between a silicon atom and a Group-III atom, a stress generating layer configured to generate compressive stress and an active layer in which an electronic element is to be formed, the reaction suppressing layer, the stress generating layer and the active layer are arranged in an order of the reaction suppressing layer, the stress generating layer and the active layer with the reaction suppressing layer being positioned the closest to the silicon wafer, and the reaction suppressing layer has, on a surface thereof that faces the stress generating layer, holes having an area of $7 \times 10^{-12}$ cm$^2$ or more at a density of $1 \times 10^8$/cm$^2$ or more and $1 \times 10^9$/cm$^2$ or less. The semiconductor wafer may further have additional features as in the above-described first aspect.

A fifth aspect of the innovations herein provides a semiconductor wafer including a silicon wafer and a nitride crystal layer on the silicon wafer. Here, the nitride crystal layer includes a reaction suppressing layer configured to suppress reaction between a silicon atom and a Group-III atom, a stress generating layer configured to generate compressive stress and an active layer in which an electronic element is to be formed, the reaction suppressing layer, the stress generating layer and the active layer are arranged in an order of the reaction suppressing layer, the stress generating layer and the active layer with the reaction suppressing layer being positioned the closest to the silicon wafer, and a Qx value of the diffraction plane (-1-14) of the reaction suppressing layer obtained by X-ray reciprocal space mapping on the nitride crystal layer falls within a range of more than −0.6427 and less than −0.63977. The semiconductor wafer may further have additional features as in the above-described first aspect.

A sixth aspect of the innovations herein provides a semiconductor wafer including a silicon wafer and a nitride crystal layer on the silicon wafer. Here, the nitride crystal layer includes a reaction suppressing layer configured to suppress reaction between a silicon atom and a Group-III atom, a stress generating layer configured to generate compressive stress and an active layer in which an electronic element is to be formed, the reaction suppressing layer, the stress generating layer and the active layer are arranged in an order of the reaction suppressing layer, the stress generating layer and the active layer with the reaction suppressing layer being positioned the closest to the silicon wafer, the stress generating layer includes a first crystal layer having a bulk crystal lattice constant of a1, and a second crystal layer in contact with a surface of the first crystal layer that faces the active layer, where the second crystal layer has a bulk crystal lattice constant of a2 (a1<a2), and the first crystal layer has a portion that contains carbon atoms at a concentration of $2 \times 10^{18}$ cm$^{-3}$ or less. The semiconductor wafer may further have additional features as in the above-described first aspect.

BRIEF DESCRIPTION OF THE DRAWINGS

FIG. 7 is a graph plotting the measure of the warpage in relation to the thickness of a first crystal layer 106a.

FIG. 8 is a graph plotting the surface roughness in relation to the thickness of the first crystal layer 106a.

FIG. 9 is a graph showing the breakdown voltage in relation to the thickness of the first crystal layer 106a.

FIG. 10 is a graph plotting the variability in sheet resistance in relation to the thickness of the first crystal layer 106a.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

First Embodiment

Figure 1:
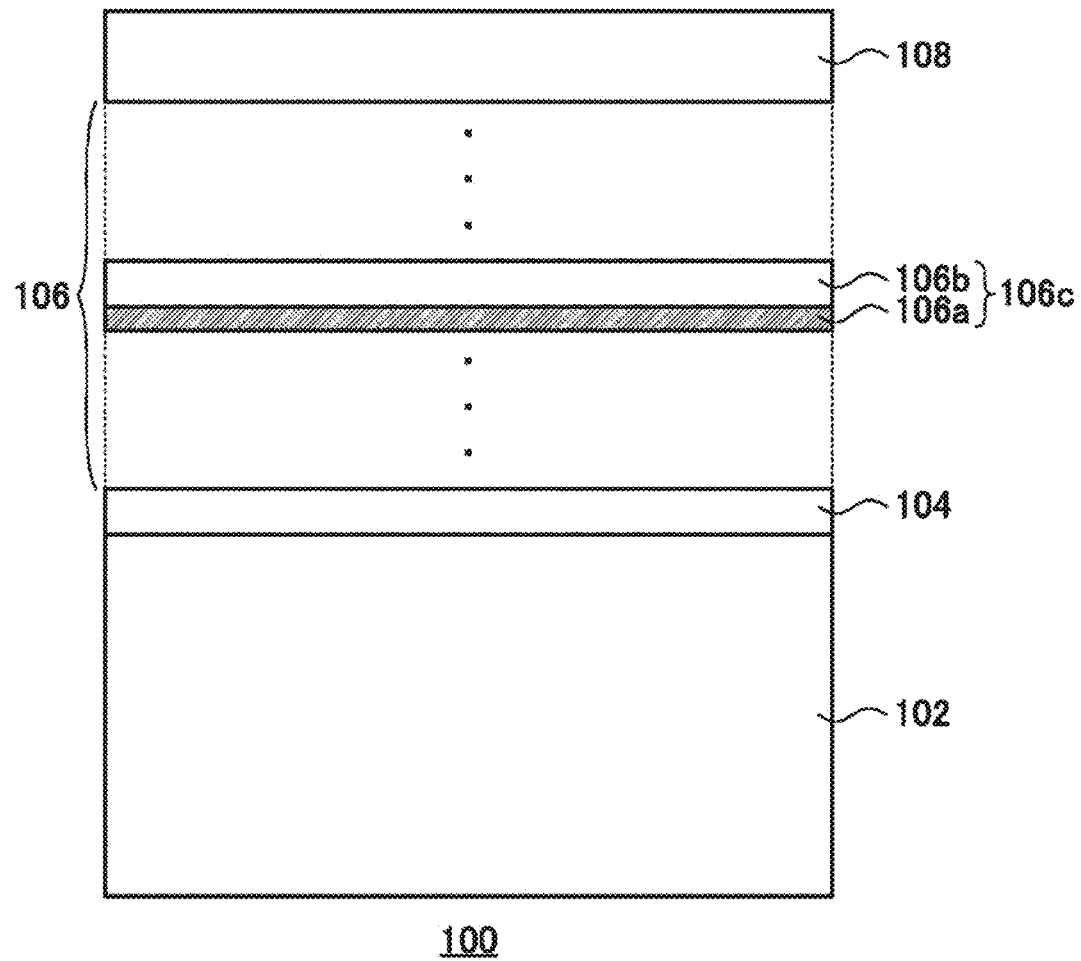
FIG. 1 is a cross-sectional view of a semiconductor wafer 100.

FIG. 1 is a cross-sectional view of a semiconductor wafer 100. The semiconductor wafer 100 includes a silicon wafer 102 and a nitride crystal layer on the silicon wafer 102. The silicon wafer 102 is a support wafer configured to support the nitride crystal layer. By using the silicon wafer 102 as the support wafer, the cost of the materials can be lowered. In addition, by using the silicon wafer 102 as the support wafer, semiconductor manufacturing equipment used for the conventional silicon processing can be used. These factors can result in higher cost competitiveness. Furthermore, since by using the silicon wafer 102 as the support wafer, large wafers having a diameter of 150 mm or more can be made available at low cost and for the industrial purposes.

The nitride crystal layer includes a reaction suppressing layer 104, a stress generating layer 106, and an active layer 108, and the reaction suppressing layer 104, the stress generating layer 106 and the active layer 108 are arranged in the order of the reaction suppressing layer 104, the stress generating layer 106, and the active layer 108 with the reaction suppressing layer 104 being positioned the closest to the silicon wafer 102.

The reaction suppressing layer 104 may be configured to suppress the reaction between silicon atoms and Group-III atoms. In other words, the reaction suppressing layer 104 can prevent the formation of alloys based on Ga contained in the Group-III nitride semiconductor layer on the reaction suppressing layer 104 and Si contained in the silicon wafer 102. The reaction suppressing layer 104 can be made of $Al_{x1}Ga_{1-x1}N$ (0<x1≤1), or typically an AlN layer. The reaction suppressing layer 104 can protect the front surface of the silicon wafer 102 and reliably support the nitride crystal layer. Furthermore, the reaction suppressing layer 104 generates the initial nucleus of the nitride crystal layer, which is to be formed on the silicon wafer 102.

In the semiconductor wafer of the present invention, the nitride layer that is first formed in the nitride crystal layer on the silicon wafer is the reaction suppressing layer 104, and the crystal characteristics of the reaction suppressing layer 104 greatly affects the crystal characteristics of the nitride crystal layer that is further coherently grown.

The surface of the reaction suppressing layer 104 that faces the stress generating layer 106 may have holes each having an area of $7 \times 10^{-12}$ cm$^2$ or more at a density of $1 \times 10^8$/cm$^2$ or more and $1 \times 10^9$/cm$^2$ or less. Y. Ohba. R. Sato, J. Crystal Growth 221, 258 (2000), G. Sarusi et al., J. Electron. Mater. 35, L15 (2006) and M. Tungare et al., J. Appl. Phys. 113, 163108 (2013) already disclose that holes may be formed in the reaction suppressing layer 104. The area and density of the holes may vary depending on the surface treatment performed on the silicon wafer 102 and the deposition conditions of the reaction suppressing layer 104. The inventors of the present invention, however, have discovered that the warpage of the semiconductor wafer 100 can be reduced and the semiconductor wafer 100 can assure appropriate uniformity while the surface of the silicon wafer 102 is effectively protected, as long as the above-described density and area requirements for the holes are satisfied. Here, the ratio of the area of the holes to the entire area in the reaction suppressing layer 104 can be 4% or less.

It is preferable that the reaction suppressing layer 104 has a Qx value of more than −0.6427 and less than −0.63977. Here, the Qx value is obtained by the X-ray reciprocal space mapping of the diffraction plane (-1-14) of the nitride crystal layer. Since the reaction suppressing layer 104 is configured in such a manner that the Qx value falls within the above-described numerical range, the front surface of the silicon wafer 102 can be effectively protected, the warpage of the semiconductor wafer 100 can be reduced, and the semiconductor wafer 100 can assure appropriate uniformity. In addition, it is preferable that the X-ray peak half width in the reciprocal lattice coordinates of the crystal constituting the reaction suppressing layer 104 falls within the range of 0.006 to 0.009 rlu (the reciprocal lattice units). Since the reaction suppressing layer 104 is configured such that the X-ray peak half width falls within the above-mentioned numerical range, the same effects can be produced.

The stress generating layer 106 includes a two-layer stack structure 106c made up by a first crystal layer 106a and a second crystal layer 106b. The first crystal layer 106a includes a portion containing carbon atoms at a concentration of $2\times10^{18}$ cm$^{-3}$ or less. Since the first crystal layer 106a is configured to have a carbon concentration of $2\times10^{18}$ cm$^{-3}$ or less, the first crystal layer 106a itself achieves improved crystallinity, which can contribute to improve the characteristics of the first crystal layer 106a including the electrical characteristics such as the withstand voltage and the sheet resistance, the mechanical characteristics such as the acoustic characteristics and the chemical characteristics such as the reactivity with the impurities. In addition, the improvement in the crystallinity of the first crystal layer 106a results in the improvement in the crystallinity of the layer formed on the first crystal layer 106a, for example, the active layer 108, which allows the layer on the first crystal layer 106a to have better electrical, mechanical and chemical characteristics. When the layer formed on the first crystal layer 106a is the active layer 108, the active layer 108 can achieve improved mobility. In other words, the active layer 108 can achieve improvement in the characteristics such as the withstand voltage and mobility while the warping of the wafer is reduced.

The first crystal layer 106a may have a portion containing carbon atoms at a concentration of $1\times10^{18}$ cm$^{-3}$ or less. In this way, the first crystal layer 106a and the layers formed thereon can achieve further improved crystallinity or characteristics.

The first crystal layer 106a preferably has a bulk crystal lattice constant of a1 and a thickness of more than 5.0 nm and less than 20 nm. The second crystal layer 106b is preferably in contact with the surface of the first crystal layer 106a that faces the active layer 108 and preferably has a bulk crystal lattice constant of a2 (a1<a2).

The first crystal layer 106a is, for example, made of $Al_xGa_{1-x}N$ (0.9≤x≤1), or typically an AlN layer. Since the first crystal layer 106a is configured to have a thickness of more than 5.0 nm, the stress generating layer 106 can have an increased withstand voltage. Note that the film flatness is more likely to be compromised as the thickness of the first crystal layer 106a increases. Therefore, the first crystal layer 106a preferably has a thickness of more than 5.0 nm and less than 10 nm, more preferably within a range of more than 6.0 nm and less than 10 nm, and particularly preferably within a range of more than 6.0 nm and less than 9 nm.

The second crystal layer 106b is, for example, made of $Al_yGa_{1-y}N$ (0≤y≤0.3). The second crystal layer 106b can have a thickness of 10 nm or more and 300 nm or less. If the second crystal layer 106b has a thickness of more than 300 nm, the semiconductor wafer 100 is more likely to be warped in an upward-convex manner. For this reason, the second crystal layer 106b preferably has a thickness of 300 nm or less. The second crystal layer 106b more preferably has a thickness of 200 nm or less, more preferably 100 nm. The second crystal layer 106b is ideally formed such that the crystal lattices of the second crystal layer 106b are coherently continuous from the crystal lattices of the first crystal layer 106a at the hetero-junction plane between the first crystal layer 106a and the second crystal layer 106b. As discussed above, the bulk crystal lattice constant a2 of the second crystal layer 106b is larger than the bulk crystal lattice constant a1 of the first crystal layer 106a. For this reason, if the second crystal layer 106b is coherent from the first crystal layer 106a, the second crystal layer 106b accumulates therein the compressive stress against the first crystal layer 106a. In this way, the compressive stress is generated in the stress generating layer 106.

The first crystal layer 106a may have a portion containing carbon atoms at a concentration of $5\times10^{18}$ cm$^{-3}$ or less, preferably $2\times10^{18}$ cm$^{-3}$ or less. Since the first crystal layer is configured to have a carbon concentration of $5\times10^{18}$ cm$^{-3}$ or less, the first crystal layer 106a itself achieves improved crystallinity, which can contribute to improve the characteristics of the first crystal layer 106a including the electrical characteristics such as the withstand voltage and the sheet resistance, the mechanical characteristics such as the acoustic characteristics and the chemical characteristics such as the reactivity with the impurities. In addition, the improvement in the crystallinity of the first crystal layer 106a results in the improvement in the crystallinity of the layer formed on the first crystal layer 106a, for example, the active layer 108, which allows the layer on the first crystal layer 106a to have better electrical, mechanical and chemical characteristics. When the layer formed on the first crystal layer 106a is the active layer 108, the active layer 108 can achieve improved mobility. In other words, the active layer 108 can achieve improvement in the characteristics such as the withstand voltage and mobility while the warping of the wafer is reduced.

The second crystal layer 106b may have a portion containing carbon atoms at a concentration of $1\times10^{18}$ cm$^{-3}$ or more. Since the second crystal layer 106b contains carbon atoms at a concentration of $1\times10^{18}$ cm$^{-3}$ or more, the second crystal layer 106b can achieve improved withstand voltage, which eventually results in improved withstand voltage of the stress generating layer 106. The second crystal layer 106b more preferably has a portion containing carbon atoms at a concentration of $5\times10^{18}$ cm$^{-3}$ or more. In this way, the second crystal layer 106b and the stress generating layer 106 can achieve even further improved withstand voltage.

Generally speaking, attempts may be made to compensate for the n-type impurities by implanting carbon for the purposes of improving the withstand voltage of a nitride layer. The inventors of the present invention, however, have examined such attempts and concluded that the implantation of carbon does not necessarily achieve sufficient withstand voltage and that, on the contrary, sufficient withstand voltage can be achieved by reducing the implantation of carbon into the first crystal layer 106a. Although the details have not been clarified how the sufficient withstand voltage has been achieved by reducing the implantation of carbon into the first crystal layer 106a, the inventors of the present invention deduce based on the results that the improvement of the resistivity resulting from the improvement of the crystallinity of the first crystal layer 106a is more effective than the compensation achieved by the implantation of carbon in the high-voltage domain of 600 V.

Note that the hetero interface between the first crystal layer 106a and the second crystal layer 106b is not an ideal coherent interface but actually has defects in a portion thereof. In the defective portion, lattice relaxation occurs. In reality, a hetero interface is considered to have a combination of coherently grown portions and defect-induced lattice-relaxed portions. In the case of the hetero interface between the first crystal layer 106a and the second crystal layer 106b, the coherently-grown portions seem to be dominant.

Since the stress generating layer 106 generates compressive stress, the compressive stress is balanced against the tensile stress generated in the nitride crystal layer due to the difference in thermal expansion coefficient. As a result, the warping of the semiconductor wafer 100 can be reduced. In addition, if the first crystal layer 106a is configured to have a thickness of more than 5.0 nm and less than 20 nm, the withstand voltage is increased and the in-plane variability in physical properties such as the sheet resistance can be reduced. In other words, the nitride crystal layer formed on the silicon wafer 102 can be more uniform.

Although coherently continuous, the first crystal layer and the second crystal layer have different lattice constants. If the lattice constants are different from each other as described above, the increase in the difference between the lattice constants and the increase in the film thickness result in accumulation of stress distortion in the film as the film grows. If the thickness of the grown film exceeds the critical film thickness, many defects may be generated in order to relax the distortion. If the film continues to grow even after the many defects are generated, the film cannot coherently grow and, instead, grows three-dimensionally. Eventually, a white and cloudy semiconductor wafer is obtained instead of a mirror-finish semiconductor wafer.

Due to the above-described problems relating to the growth process, it is difficult for a hetero stack structure such as the first crystal layer 106a and the second crystal layer 106b to achieve superior characteristics if the first crystal layer 106a has a thickness of 5 nm or more. If the first crystal layer 106a has a large thickness, the film flatness is likely to be compromised in the embodiments of the present invention. By controlling the growth conditions and the like appropriately, however, the front surface of the nitride crystal layer or the semiconductor wafer (the front surface of the active layer 108) has mirror-finish. For example, if the growth temperature becomes 900° C. or less because of the malfunctions of the heater of the growth furnace, the nitride crystal layer grows three-dimensionally and the resulting semiconductor wafer becomes white and cloudy and does not have a mirror-finish front surface. When not having a mirror-finish front surface, the semiconductor wafer had extremely high sheet resistance and the resulting device could not operate.

Generally speaking, as the thickness of a nitride crystal layer (for example, the stress generating layer 106) increases, it is expected that the resistance increases or the withstand voltage increases. Referring to the semiconductor wafer of the present invention, when the first crystal layer 106a has a thickness of 5 nm or more and a wafer having a mirror-finish front surface is used, the warping is reduced and the uniformity in mobility unexpectedly increases while the withstand voltage remains unchanged. Here, the expression of "a mirror-finish front surface" of a wafer means that the wafer is neither white nor cloudy when irradiated with normal fluorescent illumination (1000 to 5000 lux). Although it has not been clarified yet how the seemingly unrelated characteristic parameters are improved in a well-balanced manner, the inventors of the present invention deduce that the improvements may result from the warping observed during the growing process.

The active layer 108 is made of, for example, $Al_{x4}Ga_{1-x4}N$ ($0 \leq x4 < 1$) or typically a GaN layer. The active layer 108 may be an AlInGaN layer. The active layer 108 is a layer in which an electronic element is to be formed later. The active layer 108 can be divided into two layers. The upper layer can be a highly pure layer having as low concentration as possible of impurities such as carbon atoms and the lower layer can contain carbon atoms. The presence of the carbon atoms in the lower layer can contribute to increase the withstand voltage and the high purity of the upper layer can contribute to reduce the scattering of the carriers caused by the impurity atoms and thus increase the mobility.

The nitride crystal layer preferably has a thickness of 500 nm or more and 13000 nm or less. Since the nitride crystal layer is configured to have a thickness within this range, the warpage of the semiconductor wafer 100 can be reduced. When the silicon wafer 102 has a thickness of 400 µm or more and a diameter of 100 mm or more, the reaction suppressing layer 104 preferably has a thickness of 30 nm or more and 300 nm or less. Since the silicon wafer 102 and the reaction suppressing layer 104 are configured to satisfy the above ranges, the warpage of the semiconductor wafer 100 can be reduced.

The above-described nitride crystal layer has a larger thermal expansion coefficient than the silicon wafer 102. Therefore, if the temperature drops from the high temperature maintained during the epitaxial growth down to room temperature, the nitride crystal layer shrinks more than the silicon wafer 102, which resultantly generates tensile stress in the nitride crystal layer. In the semiconductor wafer 100 of the present embodiment, however, the stress generating layer 106 generates compressive stress. Accordingly, the compressive stress can be balanced against the tensile stress generated by the temperature drop in the nitride crystal layer. In this way, the warping of the semiconductor wafer 100 can be reduced. In the semiconductor wafer 100 of the present embodiment, the first crystal layer 106a has a thickness of more than 5.0 nm. Therefore, high withstand voltage can be achieved and the in-plane uniformity in the film physical properties such as the sheet resistance can be enhanced.

Note that, as long as the stress generating layer 106 includes the two-layer stack structure 106c made up by the first crystal layer 106a and the second crystal layer 106b, the other layer features of the stress generating layer 106 are freely designed. For example, the stress generating layer 106 may be a so-called graded crystal layer in which the crystal layers making up the stress generating layer 106 have successively changing compositions in the depth direction. In this case, the stress generating layer 106 may be configured such that the Ga ratio increases toward the front surface. It is not preferable that the stress generating layer 106 has such layer features that may completely or partially offset the compressive stress generated by the two-layer stack structure 106c.

Figure 2:
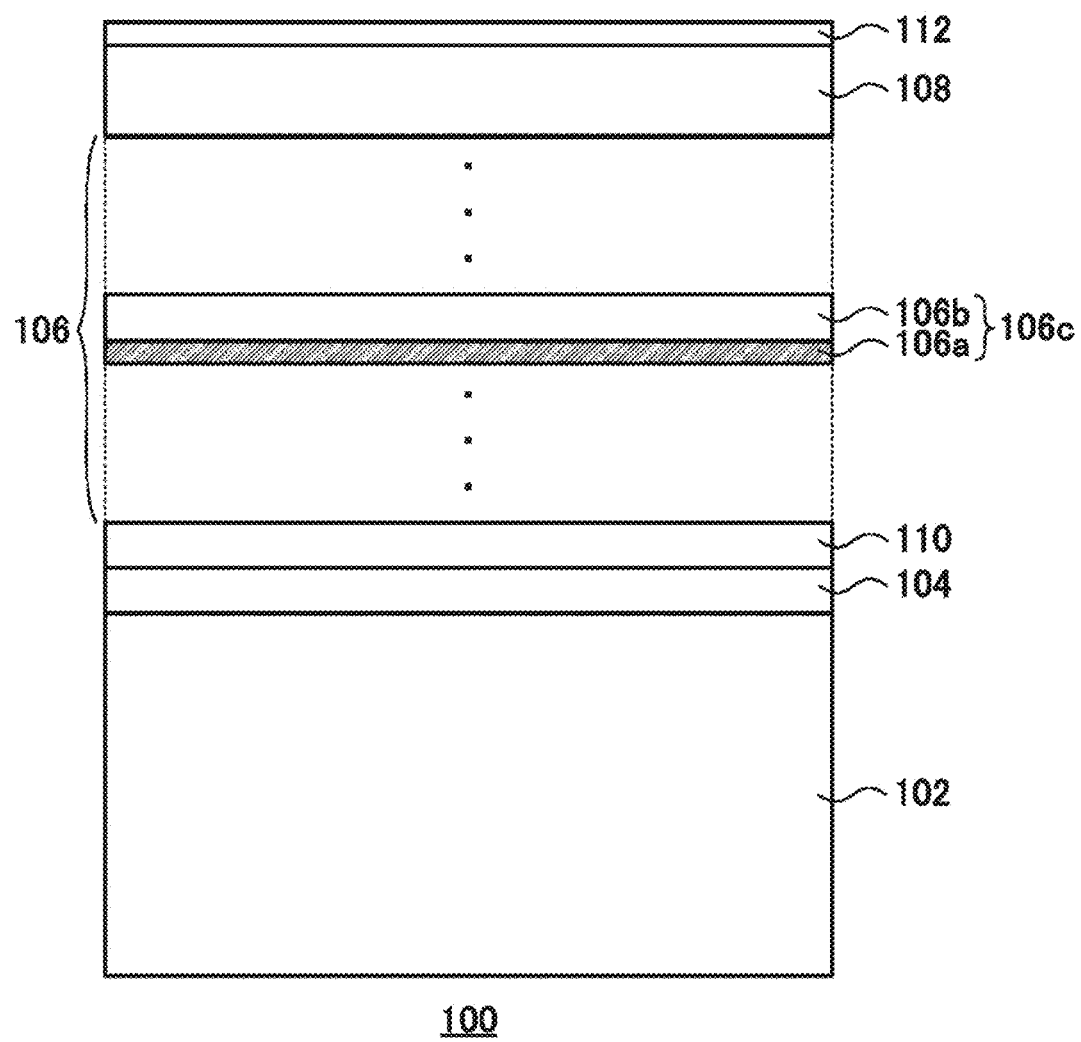
FIG. 2 is a cross-sectional view showing a modification example of the semiconductor wafer 100.

Any layers can be positioned between the reaction suppressing layer 104 and the stress generating layer 106, between the stress generating layer 106 and the active layer 108, or on the active layer 108. For example, as shown in FIG. 2, an intermediate layer 110 may be formed between the reaction suppressing layer 104 and the stress generating layer 106, and a Schottky layer 112 may be formed on the active layer 108.

The intermediate layer 110 is positioned between the reaction suppressing layer 104 and the stress generating layer 106 and in contact with the reaction suppressing layer 104, and has a larger bulk crystal lattice constant than the reaction suppressing layer 104. The intermediate layer 110 is made of, for example, $Al_{x2}Ga_{1-x2}N$ ($0 < x2 < 1$). The intermediate layer 110 can be ideally formed such that the crystal lattices of the intermediate layer 110 are coherently continuous from the crystal lattices of the reaction suppressing layer 104 at the hetero-junction plane between the intermediate layer 110 and the reaction suppressing layer 104. In this way, the intermediate layer 110 can generate compressive stress due to the difference in lattice constant between the intermediate layer 110 and the reaction suppressing layer 104. The intermediate layer 110 increases the size of the initial nucleus formed in the reaction suppressing layer 104 to form a base plane for the stress generating layer 106, which is to be formed on the intermediate layer 110.

The above describes that the intermediate layer 110 and the reaction suppressing layer 104 are coherently continuous at the hetero interface therebetween, but this requirement is merely ideal. In reality, lattice relaxation occurs due to defects and the like and the coherently grown regions are only dominant. This has been similarly explained in relation to the hetero interface between the first crystal layer 106a and the second crystal layer 106b.

The Schottky layer 112 is made of, for example, $Al_{x5}Ga_{1-x5}N$ (0<x5<1). At the hetero interface between the active layer 108 and the Schottky layer 112, two-dimensional electron gas (2DEG) is generated, which can serve as the channel layer of the transistor. The Schottky layer 112 can be modified as appropriate depending on the structure of the transistor to be formed.

Second Embodiment

Figure 3:
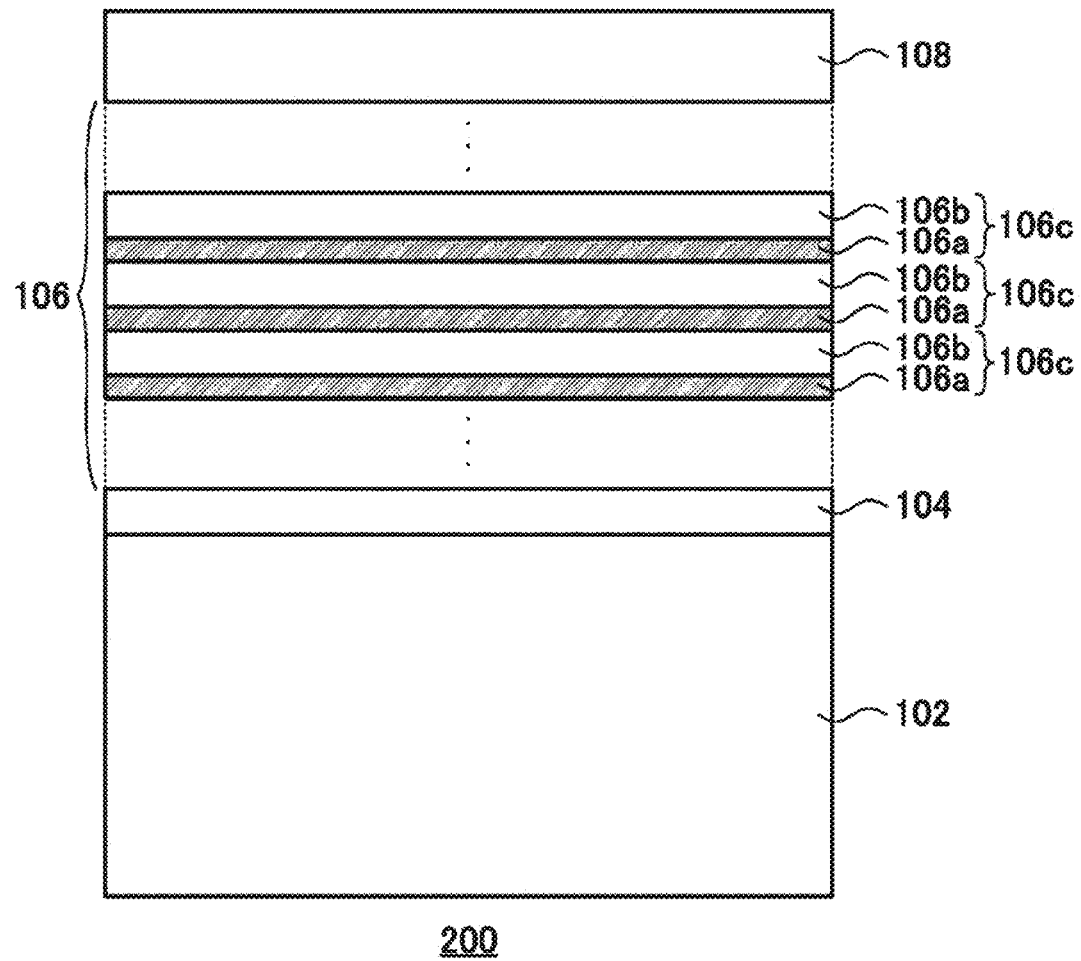
FIG. 3 is a cross-sectional view of a semiconductor wafer 200.

FIG. 3 is a cross-sectional view of a semiconductor wafer 200. The semiconductor wafer 200 includes a nitride crystal layer on a silicon wafer 102, like the semiconductor wafer 100. The nitride crystal layer includes a reaction suppressing layer 104, a stress generating layer 106 and an active layer 108. Differently from the semiconductor wafer 100, the semiconductor wafer 200 includes a plurality of two-layer stack structures 106c in the stress generating layer 106. Except for this, the semiconductor wafer 200 is the same as the semiconductor wafer 100.

The plurality of two-layer stack structures 106c may constitute a multi-layered stack structure in which many two-layer stack structures 106c are repetitively stacked, in other words, a superlattice structure. The number of the two-layer stack structures 106c can range, for example, from 2 to 500. By stacking many two-layer stack structures 106c, the stress generating layer 106 can generate increased compressive stress. In addition, by controlling the number of the two-layer stack structures 106c stacked on each other, the magnitude of the compressive stress generated in the stress generating layer 106 can be easily controlled. Furthermore, by stacking many two-layer stack structures 106c, the effects of improving the withstand voltage through the presence of the first crystal layer 106a can be enhanced.

Third Embodiment

Figure 4:
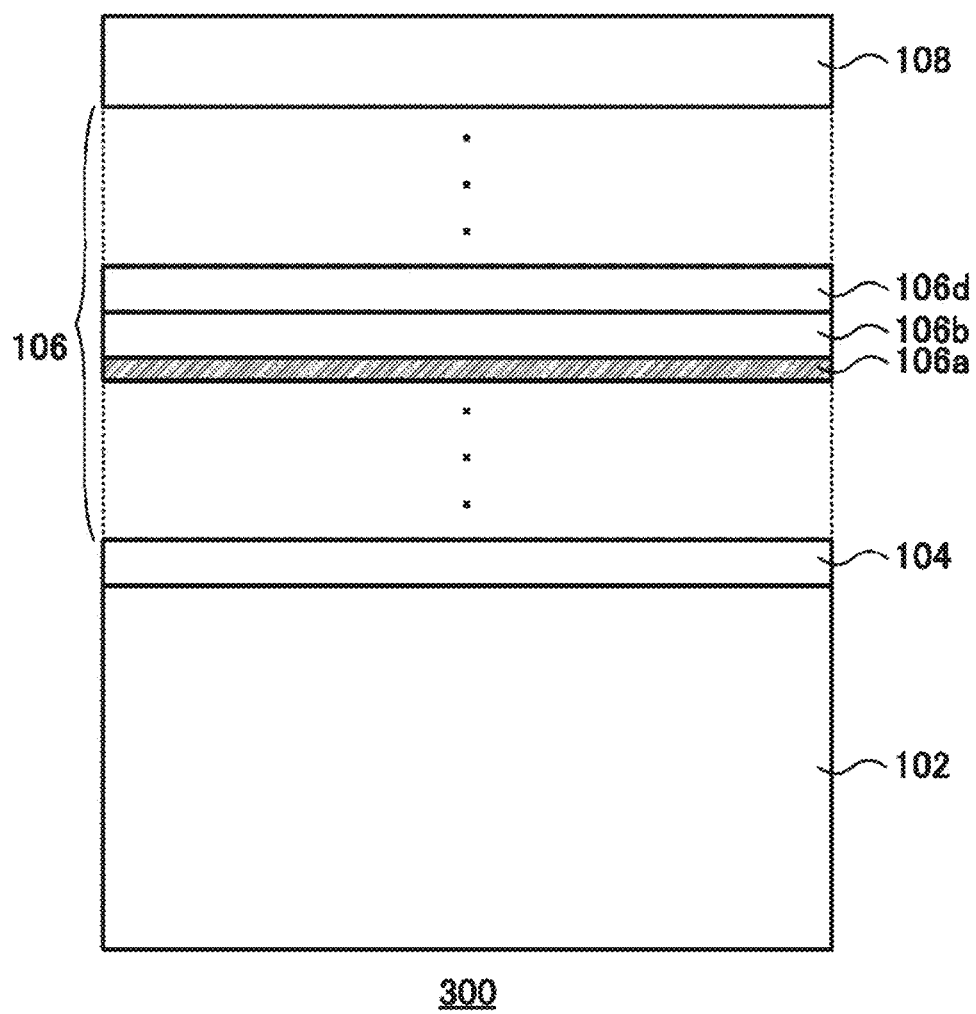
FIG. 4 is a cross-sectional view of a semiconductor wafer 300.

FIG. 4 is a cross-sectional view of a semiconductor wafer 300. The semiconductor wafer 300 includes a nitride crystal layer on a silicon wafer 102, like the semiconductor wafer 100. The nitride crystal layer includes a reaction suppressing layer 104, a stress generating layer 106 and an active layer 108. Differently from the semiconductor wafer 100, the semiconductor wafer 300 further includes a third crystal layer 106d in the stress generating layer 106. The third crystal layer 106d is in contact with the surface of the second crystal layer 106b that faces the active layer 108 and has a bulk crystal lattice constant of a3 (a2<a3). Except for this, the semiconductor wafer 300 is the same as the semiconductor wafer 100.

The third crystal layer 106d is, for example, made of $Al_yGa_{1-y}N$ (0≤y<1), or typically an AlGaN layer. The third crystal layer 106d can have any thickness. The third crystal layer 106d is ideally formed such that the crystal lattices of the third crystal layer 106d are coherently continuous from the crystal lattices of the second crystal layer 106b at the hetero-junction plane between the second crystal layer 106b and the third crystal layer 106d. The bulk crystal lattice constant a3 of the third crystal layer 106d is larger than the bulk crystal lattice constant a2 of the second crystal layer 106b. For this reason, the third crystal layer 106d accumulates therein the compressive stress against the second crystal layer 106b. Accordingly, the compressive stress generated by the third crystal layer 106d and the second crystal layer 106b is superimposed on the compressive stress generated by the first crystal layer 106a and the second crystal layer 106b. As a result, the stress generating layer 106 generates larger compressive stress.

The above describes that the third crystal layer 106d and the second crystal layer 106b are coherently continuous at the hetero interface therebetween, but this requirement is merely ideal. In reality, lattice relaxation occurs due to defects and the like and the coherently grown regions are only dominant. This has been similarly explained in relation to the hetero interface between the first crystal layer 106a and the second crystal layer 106b.

Fourth Embodiment

Figure 5:
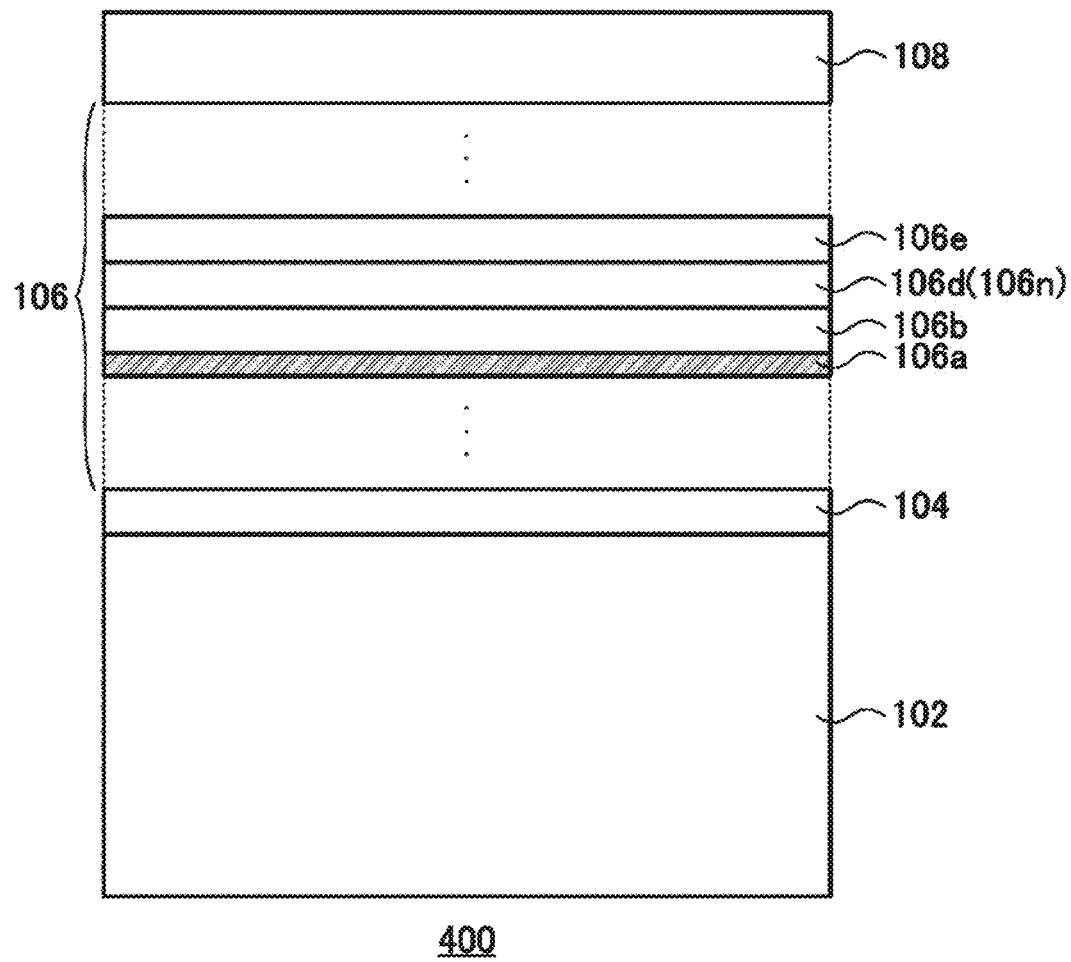
FIG. 5 is a cross-sectional view of a semiconductor wafer 400.

FIG. 5 is a cross-sectional view of a semiconductor wafer 400. The semiconductor wafer 400 includes a nitride crystal layer on a silicon wafer 102, like the semiconductor wafer 100. The nitride crystal layer includes a reaction suppressing layer 104, a stress generating layer 106 and an active layer 108. Differently from the semiconductor wafer 100, the semiconductor wafer 400 further includes a fourth crystal layer 106e in the stress generating layer 106. The fourth crystal layer 106e is in contact with the surface of an n-th crystal layer 106n that faces the active layer 108 and has a bulk crystal lattice constant of a4. The n-th crystal layer 106n is positioned closer to the active layer 108 than the second crystal layer 106b is and the bulk crystal lattice constant a4 is larger than the lattice constant of the n-th crystal layer 106n. Except for this, the semiconductor wafer 400 is the same as the semiconductor wafer 100. When the n-th crystal layer 106n is the third crystal layer 106d included in the semiconductor wafer 300, the semiconductor wafer 400 is structured such that the first crystal layer 106a, the second crystal layer 106b, the third crystal layer 106d and the fourth crystal layer 106e are sequentially stacked and the bulk crystal lattice constant increases in the direction from the first crystal layer 106a to the fourth crystal layer 106e.

The fourth crystal layer 106e is, for example, made of $Al_yGa_{1-y}N$ (0≤y<1), or typically an AlGaN layer. The fourth crystal layer 106e can have any thickness. The fourth crystal layer 106e is ideally formed such that the crystal lattices of the fourth crystal layer 106e are coherently continuous from the crystal lattices of the n-th crystal layer 106n at the hetero-junction plane between the fourth crystal layer 106e and the n-th crystal layer 106n. The bulk crystal lattice constant of the fourth crystal layer 106e is larger than the bulk crystal lattice constant of the n-th crystal layer 106n. For this reason, the fourth crystal layer 106e accumulates therein the compressive stress against the n-th crystal layer 106n. Accordingly, the compressive stress generated by the n-th crystal layer 106n and the fourth crystal layer 106e is superimposed on the compressive stress generated by the first crystal layer 106a and the second crystal layer 106b. As a result, the stress generating layer 106 generates larger compressive stress.

The above describes that the fourth crystal layer 106e and the n-th crystal layer 106n are coherently continuous at the hetero interface therebetween, but this requirement is merely ideal. In reality, lattice relaxation occurs due to defects and the like and the coherently grown regions are only dominant. This has been similarly explained in relation to the hetero interface between the first crystal layer 106a and the second crystal layer 106b.

Fifth Embodiment

Figure 6:
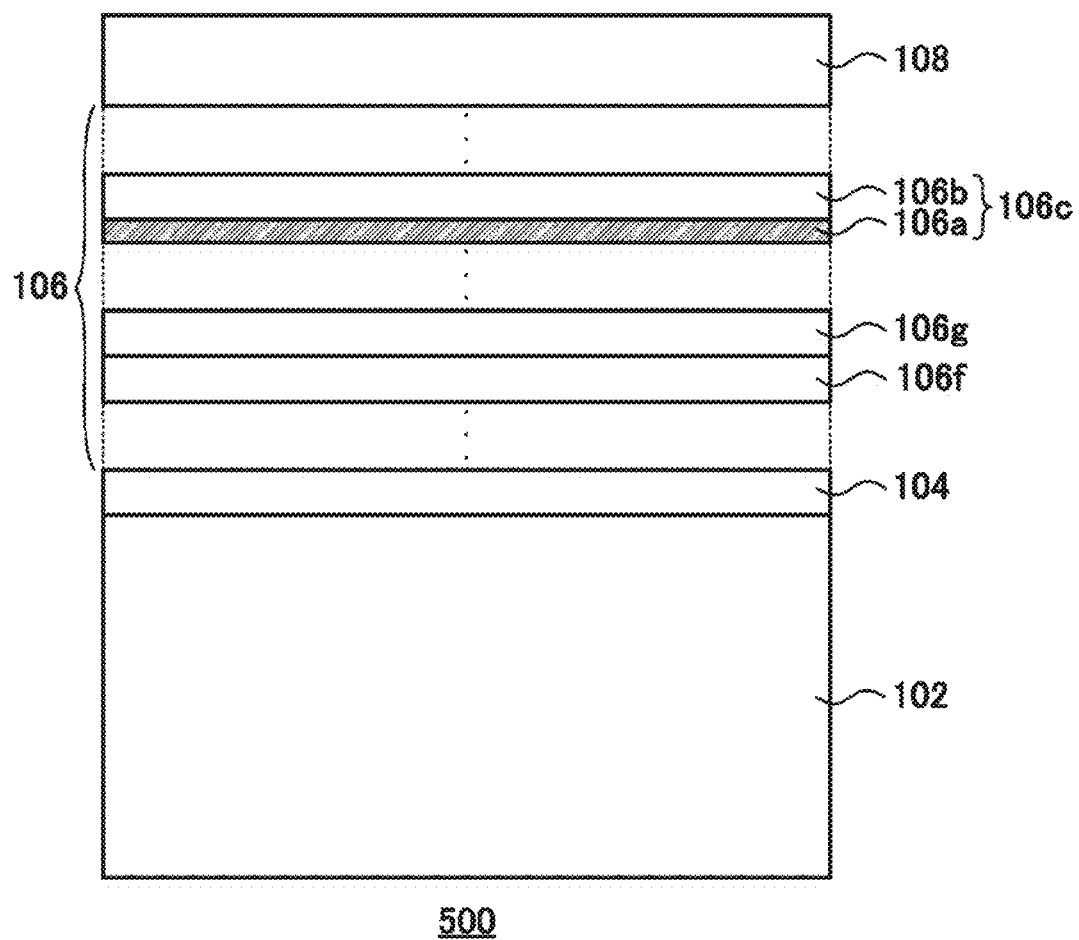
FIG. 6 is a cross-sectional view of a semiconductor wafer 500.

FIG. 6 is a cross-sectional view of a semiconductor wafer 500. The semiconductor wafer 500 includes a nitride crystal layer on a silicon wafer 102, like the semiconductor wafer 100. The nitride crystal layer includes a reaction suppressing layer 104, a stress generating layer 106 and an active layer 108. Differently from the semiconductor wafer 100, the semiconductor wafer 500 further includes a fifth crystal layer 106f and a sixth crystal layer 106g in the stress generating layer 106. The fifth crystal layer 106f has a bulk crystal lattice constant of a5, and the sixth crystal layer 106g is in contact with the surface of the fifth crystal layer 106f that faces the active layer 108 and has a bulk crystal lattice constant of a6 (a5<a6). Except for this, the semiconductor wafer 500 is the same as the semiconductor wafer 100.

The fifth crystal layer 106f is, for example, made of $Al_yGa_{1-y}N$ (0<y≤1), or typically an AlGaN layer. The fifth crystal layer 106f can have any thickness and may have a thickness of 5 nm or less. The sixth crystal layer 106g is, for example, made of $Al_yGa_{1-y}N$ (0≤y<1), or typically an AlGaN layer. The sixth crystal layer 106g can have any thickness. The sixth crystal layer 106g is ideally formed such that the crystal lattices of the sixth crystal layer 106g are coherently continuous from the crystal lattices of the fifth crystal layer 106f at the hetero-junction plane between the sixth crystal layer 106g and the fifth crystal layer 106f. As discussed above, the bulk crystal lattice constant a6 of the sixth crystal layer 106g is larger than the bulk crystal lattice constant a5 of the fifth crystal layer 106f. For this reason, if the sixth crystal layer 106g is coherent from the fifth crystal layer 106f, the sixth crystal layer 106g accumulates therein the compressive stress against the fifth crystal layer 106f. Accordingly, the compressive stress generated by the fifth crystal layer 106f and the sixth crystal layer 106g is superimposed on the compressive stress generated by the first crystal layer 106a and the second crystal layer 106b. As a result, the stress generating layer 106 generates larger compressive stress.

The above describes that the fifth crystal layer 106f and the sixth crystal layer 106g are coherently continuous at the hetero interface therebetween, but this requirement is merely ideal. In reality, lattice relaxation occurs due to defects and the like and the coherently grown regions are only dominant. This has been similarly explained in relation to the hetero interface between the first crystal layer 106a and the second crystal layer 106b. FIG. 6 shows that the fifth crystal layer 106f and the sixth crystal layer 106g are positioned closer to the wafer than the two-layer stack structure 106c is, but may be positioned closer to the active layer 108 than the two-layer stack structure 106c is.

The layer structures described in the above second to fifth embodiments can be freely combined with each other unless the combinations are inconsistent with the spirit of the invention. In addition, the compositions of the individual crystal layers and the distributions within the individual layers discussed with reference to the first to fifth embodiments are freely modified as long as the specified requirements are satisfied. For example, the distribution of the composition in each crystal layer in the thickness direction may be uniform or graded. The thicknesses of the individual crystal layers described in the first to fifth embodiments are freely modified as long as the specified requirements are satisfied. The combinations of the composition distributions and the thicknesses of the individual crystal layers can be freely modified as long as the specified requirements are satisfied.

The crystal layers described in the first to fifth embodiments can be formed using generally known epitaxial growth techniques such as metal organic chemical vapor deposition (MOCVD). The manufacturing conditions for the MOCVD technique, such as the source gases, manufacturing equipment, deposition temperatures can be set the same as the known materials, equipment and conditions. Regarding the method of manufacturing the semiconductor wafers 100 to 500, however, the thickness t of the first crystal layer 106a is determined according to Expression 1 and the first crystal layer 106a can be formed to have the determined thickness t.

$$t = 0.00050 \times T + 3.5 \text{ (nm)} \qquad \text{(Expression 1)}$$

Here, T denotes the total thickness of the nitride crystal layer. In this way, the manufactured semiconductor wafer 100 and the other manufactured semiconductor wafers can experience only small warping and achieve high withstand voltage.

In the above-described first to fifth embodiments, at the hetero-junction plane between the first crystal layer 106a and a lower crystal layer that is positioned closer to the silicon wafer 102 than the first crystal layer 106a is, it is preferable that the crystal lattices of the first crystal layer 106a are not coherently continuous from the crystal lattices of the lower crystal layer and that lattice relaxation resultantly occurs. Here, the expression "not coherently continuous and lattice relaxation resultantly occurs" does not mean that ideal and perfect lattice relaxation occurs but that the interface has a combination of the coherent regions and the lattice-relaxed regions and that the lattice-relaxed regions are dominant.

In the above-described first to fifth embodiments, the bulk crystal lattice constants of the crystal layers that are made of $Al_xGa_{1-x}N$ (0<x<1) and constitute the nitride crystal layer can be controlled by varying the Al ratio x. The coherent or non-coherent growth at the hetero-junction plane can be controlled by varying the processing conditions such as the growth temperature.

Sixth Embodiment

In the first to fifth embodiments, the characteristics of the present invention are embodied as the semiconductor wafers 100 to 500, but the characteristics of the present invention can also be embodied as a method of inspecting a semiconductor wafer. In other words, the characteristics of the present invention can be embodied as a method of inspecting a semiconductor wafer including a silicon wafer 102 and a nitride crystal layer on the silicon wafer 102, the nitride crystal layer including a reaction suppressing layer 104 configured to suppress reaction between a silicon atom and a Group-III atom, a stress generating layer 106 configured to generate compressive stress and an active layer 108 in which an electronic element is to be formed, the reaction suppressing layer 104, the stress generating layer 106 and the active layer 108 being arranged in an order of the reaction suppressing layer 104, the stress generating layer 106 and the active layer 108 with the reaction suppressing layer 104 being positioned the closest to the silicon wafer 102. Here, the semiconductor wafer is judged to pass the inspection when a Qx value of the reaction suppressing layer 104 obtained by X-ray reciprocal space mapping on the diffraction plane (-1-14) of the nitride crystal layer falls within a range of more than −0.6427 and less than −0.63977. Here, the diffraction plane (-1-14) uses the Miller indices to note the plane on which the X-ray is diffracted, to be specific, based on the plane notation (hkl) using the Miller indices and h=−1, k=−1 and l=4. Here, the index "−1" may be written with a bar by adding a horizontal line above the number "1."

Here, the semiconductor wafer can be judged to pass the inspection if the Qx value falls within the range of more than −0.6427 and less than −0.63977 and, additionally, if an X-ray peak half width in reciprocal lattice coordinates of a crystal constituting the reaction suppressing layer 104 falls within a range of 0.006 to 0.009 rlu.

FIRST WORKING EXAMPLE

The reaction suppressing layer 104, the intermediate layer 110, the stress generating layer 106, the active layer 108 and the Schottky layer 112 were sequentially formed using MOCVD on the silicon wafer 102 (having a diameter of 150 mm). An AlN layer having a thickness of 150 to 230 nm was formed as the reaction suppressing layer 104, and an AlGaN layer having a thickness of 250 nm was formed as the intermediate layer 110. An AlN layer having a thickness of 4.6 to 8.5 nm was formed as the first crystal layer 106a, an AlGaN layer having a thickness of 20 to 28 nm was formed as the second crystal layer 106b and 60 to 120 two-layer stack structures 106c, each of which is made up by an AlN layer and an AlGaN layer, were stacked. The result was the stress generating layer 106. A GaN layer having a thickness of 600 to 1200 nm was formed as the active layer 108, and an AlGaN layer having a thickness of 25 nm was formed as the Schottky layer 112. The compositions of the respective layers were varied by changing the ratio of the Al source gas to the Ga source gas. The growth temperature was varied within the range of 1100 to 1175° C.

In the above-described manner, semiconductor wafers of first to eighth exemplary experiments were manufactured. Table 1 shows the designed thickness (units: nm) of each crystal layer in each exemplary experiment.

TABLE 1

| | REACTION SUPPRESSING LAYER 104 | INTERMEDIATE LAYER 110 | $1^{ST}$ CRYSTAL LAYER 106A | $2^{ND}$ CRYSTAL LAYER 106B | NUMBER OF REPETITIONS | STRESS GENERATING LAYER 106 | ACTIVE LAYER 108 | SCHOTTKY LAYER 112 | TOTAL |
|---|---|---|---|---|---|---|---|---|---|
| $1^{ST}$ EXEMPLARY EXPERIMENT | 180 | 250 | 6.7 | 24 | 60 | 1842 | 600 | 25 | 2897 |
| $2^{ND}$ EXEMPLARY EXPERIMENT | 150 | 250 | 7.3 | 24 | 60 | 1878 | 600 | 25 | 2903 |
| $3^{RD}$ EXEMPLARY EXPERIMENT | 180 | 250 | 4.6 | 24 | 60 | 1716 | 600 | 25 | 2771 |
| $4^{TH}$ EXEMPLARY EXPERIMENT | 180 | 250 | 7.7 | 26 | 99 | 3336.3 | 600 | 25 | 4391.3 |
| $5^{TH}$ EXEMPLARY EXPERIMENT | 230 | 250 | 6.3 | 20 | 111 | 2919.3 | 1200 | 25 | 4624.3 |
| $6^{TH}$ EXEMPLARY EXPERIMENT | 230 | 250 | 4.6 | 20 | 120 | 2952 | 1200 | 25 | 4657 |
| $7^{TH}$ EXEMPLARY EXPERIMENT | 230 | 250 | 4.6 | 26 | 90 | 2754 | 1200 | 25 | 4459 |
| $8^{TH}$ EXEMPLARY EXPERIMENT | 190 | 250 | 8.5 | 28 | 120 | 4380 | 1000 | 25 | 5845 |

Table 2 evaluates the total thickness, warpage, surface roughness, breakdown voltage, variability in sheet resistance of the semiconductor wafers of first to eighth exemplary experiments.

The thickness was measured using ellipsometry, and the surface roughness was evaluated using the roughness of root mean square (RMS) in the 10-μm-square field of view of the atomic force microscope (AFM).

TABLE 2

| | TOTAL THICKNESS (nm) | WARPAGE (μm) | SURFACE ROUGHNESS (nm) | BREAKDOWN VOLTAGE (V) | SHEET RESISTANCE VARIABILITY (Ω/□) |
|---|---|---|---|---|---|
| $1^{ST}$ EXEMPLARY EXPERIMENT | 2861 | 83 | 0.6 | 600 | 4.1 |

TABLE 2-continued

| | TOTAL THICKNESS (nm) | WARPAGE (μm) | SURFACE ROUGHNESS (nm) | BREAKDOWN VOLTAGE (V) | SHEET RESISTANCE VARIABILITY (Ω/□) |
|---|---|---|---|---|---|
| 2$^{ND}$ EXEMPLARY EXPERIMENT | 2779 | 74 | 1.1 | 670 | 2 |
| 3$^{RD}$ EXEMPLARY EXPERIMENT | 2864 | 138 | 0.8 | 560 | 2.9 |
| 4$^{TH}$ EXEMPLARY EXPERIMENT | 4315 | 89 | 1.4 | 880 | 4.3 |
| 5$^{TH}$ EXEMPLARY EXPERIMENT | 4386 | 65 | 0.8 | 700 | 3.9 |
| 6$^{TH}$ EXEMPLARY EXPERIMENT | 4509 | 126 | 0.66 | 630 | 7.1 |
| 7$^{TH}$ EXEMPLARY EXPERIMENT | 4301 | 123 | 0.7 | 620 | 7.1 |
| 8$^{TH}$ EXEMPLARY EXPERIMENT | 5692 | 42 | 1.2 | 979 | 2.8 |

The total thickness of the reaction suppressing layer 104, the intermediate layer 110, the stress generating layer 106, the active layer 108 and the Schottky layer 112 fell within the range of 2779 to 5692 nm and was thus substantially equal to the designed thickness. FIGS. 7 to 10 are graphs that respectively plot the thickness of the first crystal layer 106a against the warpage, surface roughness, breakdown voltage, and variability in sheet resistance.

Figure 7:
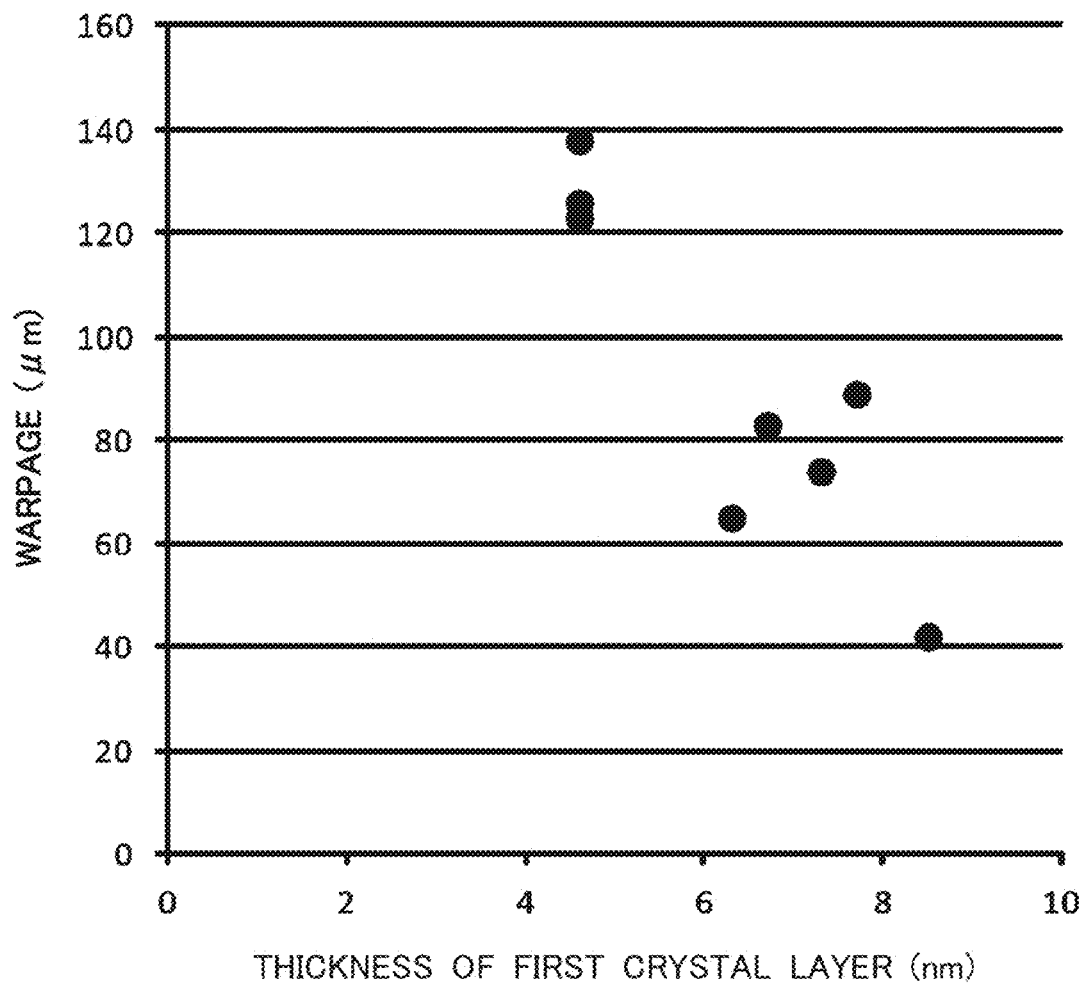
Figure 8:
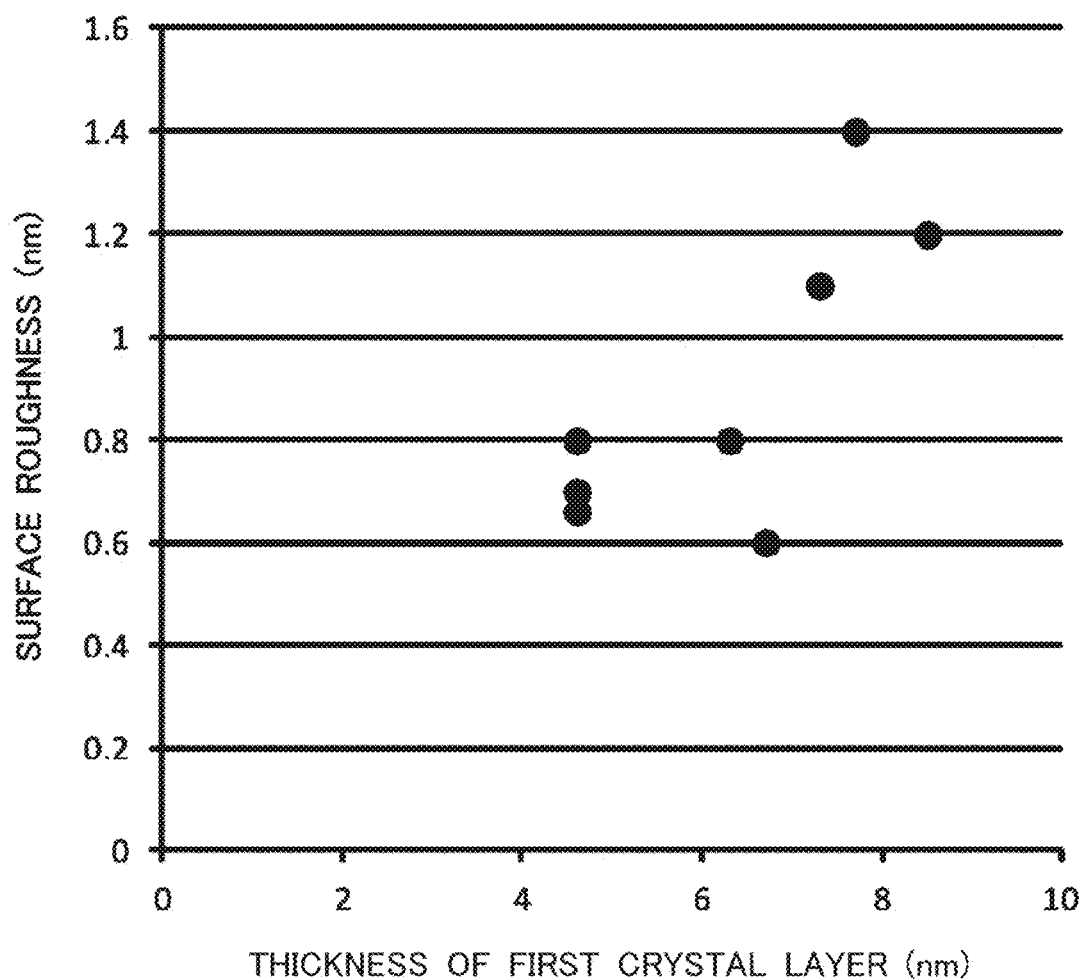

The graph in FIG. 7 shows that the warpage is large or large in the negative direction when the thickness of the first crystal layer 106a is 5.0 nm or less and the warpage is small when the thickness of the first crystal layer 106a exceeds 5.0 nm. When the thickness exceeds 5.0 nm, it cannot be found that the warpage is clearly dependent on the thickness of the first crystal layer 106a. The graph in FIG. 8 indicates that, as the thickness of the first crystal layer 106a increases, the surface roughness increases. For this reason, the thickness of the first crystal layer 106a is set to be less than 20 nm, preferably 10 nm or less, more preferably 9 nm or less in the present invention.

Figure 9:
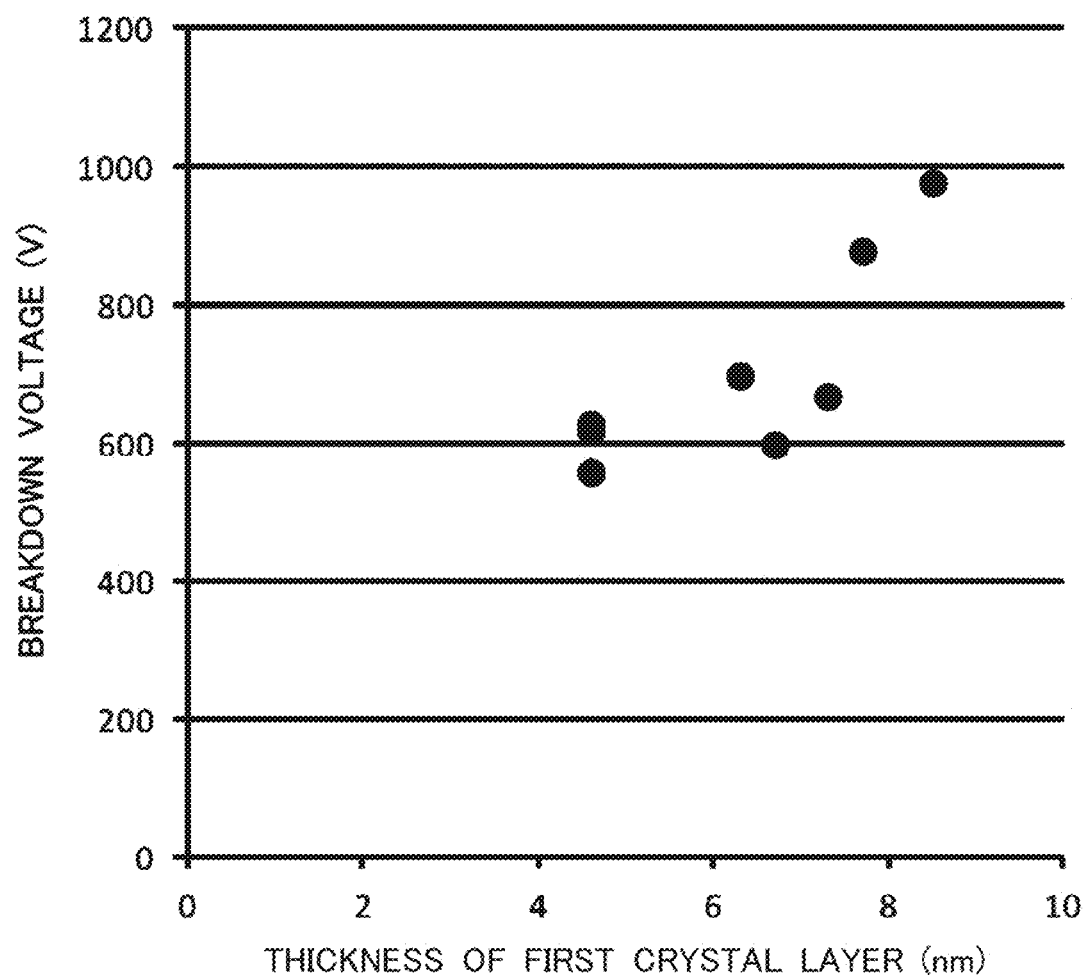

The graph in FIG. 9 shows that, as the thickness of the first crystal layer 106a increases, the breakdown voltage increases, in other words, the withstand voltage is improved. It has been confirmed that the breakdown voltage of 600 V or more, or excellent withstand voltage can be realized when the thickness of the first crystal layer 106a exceeds 5.0 nm.

Figure 10:
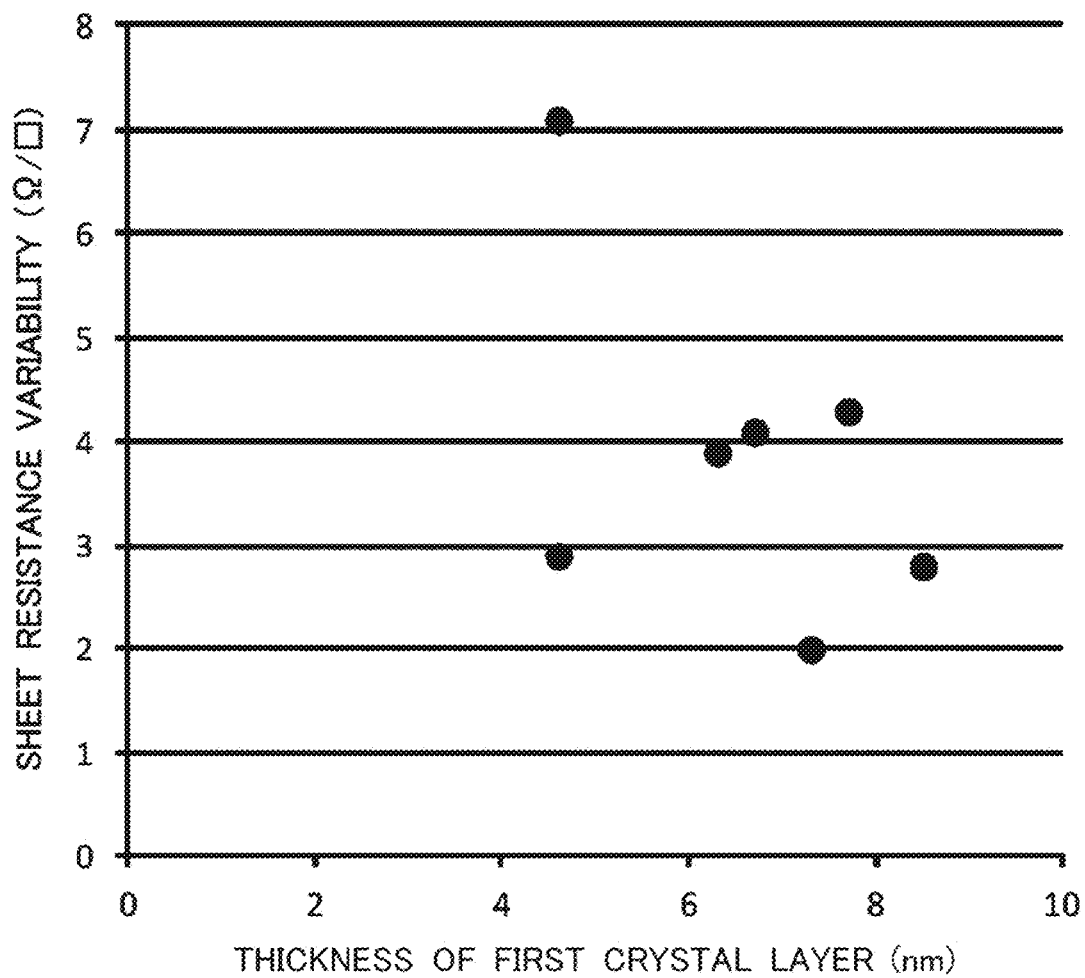

The graph in FIG. 10 indicates that the variability in sheet resistance value is large when the thickness of the first crystal layer 106a is 5.0 nm or less. This means that the uniformity is compromised when the thickness of the first crystal layer 106a is 5.0 nm or less, and that the physical properties such as the sheet resistance are excellently uniform when the thickness of the first crystal layer 106a falls within the range defined in the present invention or within the range of more than 5.0 nm and less than 20 nm.

When the semiconductor wafers of the first to eighth exemplary experiments were observed with the naked eye under fluorescent illumination having illuminance of 2000 lux, none of the semiconductor wafers had a white and cloudy front surface and all of the semiconductor wafers had a mirror-finish surface.

SECOND WORKING EXAMPLE

The reaction suppressing layer 104, the intermediate layer 110, the stress generating layer 106, the active layer 108 and the Schottky layer 112 were sequentially formed using MOCVD on the silicon wafer 102. The front surface of the silicon wafer 102 was treated using ammonia or the Al source gas prior to the formation of the reaction suppressing layer 104, and an AlN layer having a thickness of 150 nm was formed as the reaction suppressing layer 104. An AlGaN layer having a thickness of 250 nm was formed as the intermediate layer 110. An AlN layer having a thickness of 7 nm was formed as the first crystal layer 106a, an AlGaN layer having a thickness of 28 nm was formed as the second crystal layer 106b, and 84 two-layer stack structures 106c, each of which is made up by an AlN layer and an AlGaN layer, were stacked. The result was the stress generating layer 106. A GaN layer having a thickness of 1500 nm was formed as the active layer 108, and an AlGaN layer having a thickness of 25 nm was formed as the Schottky layer 112. The compositions of the respective layers were varied by changing the ratio of the Al source gas to the Ga source gas. The growth temperature was varied within the range of 1130 to 1260° C.

Figure 11:
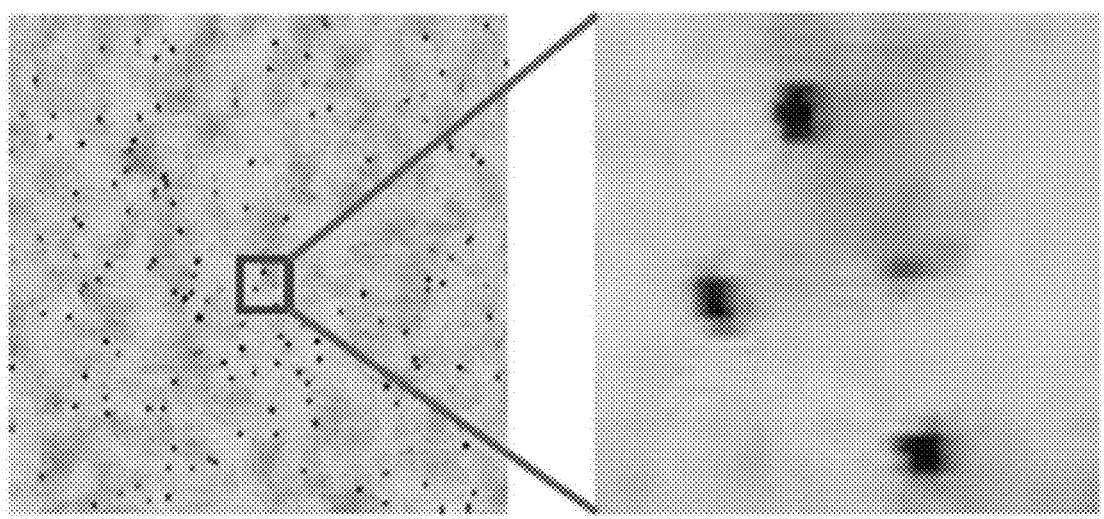
FIG. 11 presents AFM images showing the front surface of a reaction suppressing layer 104.

FIG. 11 shows atomic force microscope (AFM) images that is obtained using an AFM and shows the front surface of the reaction suppressing layer 104 during the formation of the reaction suppressing layer 104. The black (dark) portions are the holes. The size (area) of the holes is approximately $7 \times 10^{-12}$ cm$^2$ or more.

Figure 12:
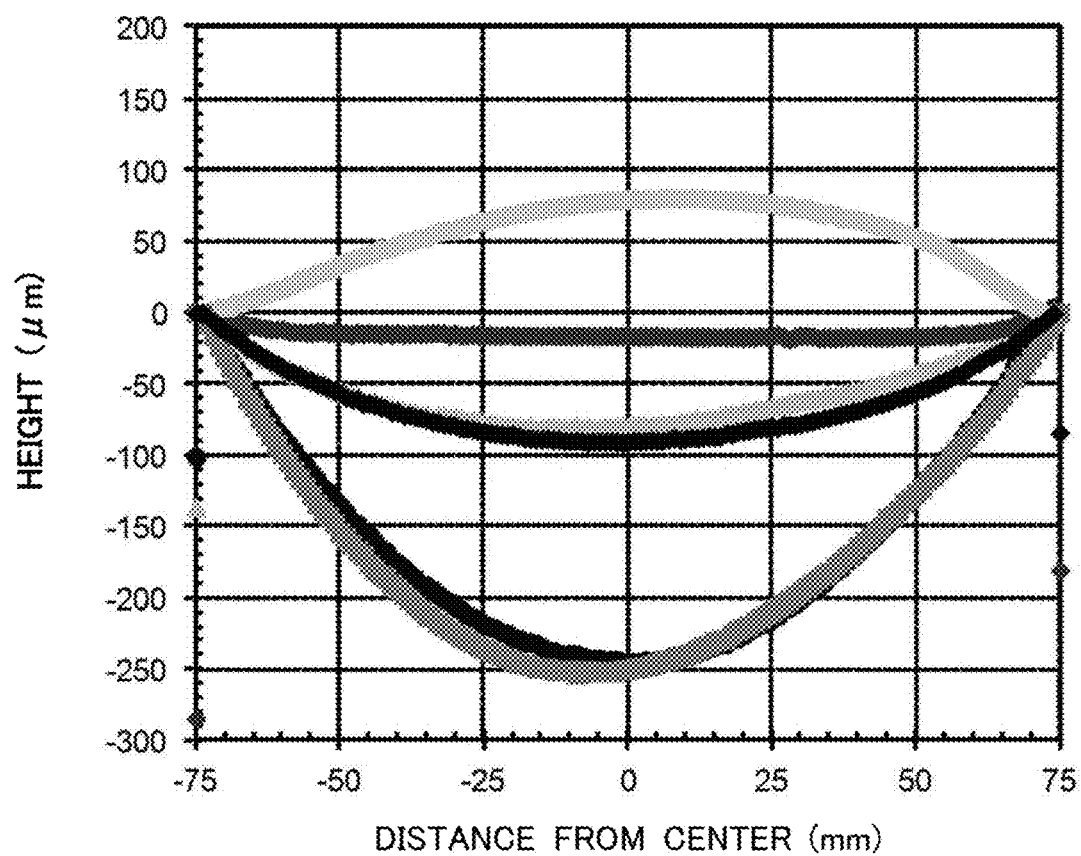
FIG. 12 is a graph showing how the wafer is warped.

FIG. 12 is a graph showing how the warping is affected by the changes in the pre-treatment conditions performed prior to the formation of the reaction suppressing layer 104. The horizontal axis represents the distance from the center of the wafer and the vertical axis represents the position (height) of the front surface in relation to the distance from the center of the wafer. In other words, the wafer is warped in an upward-convex or downward-convex manner, and the height of the warping varies depending on the pre-treatment conditions.

Figure 13:
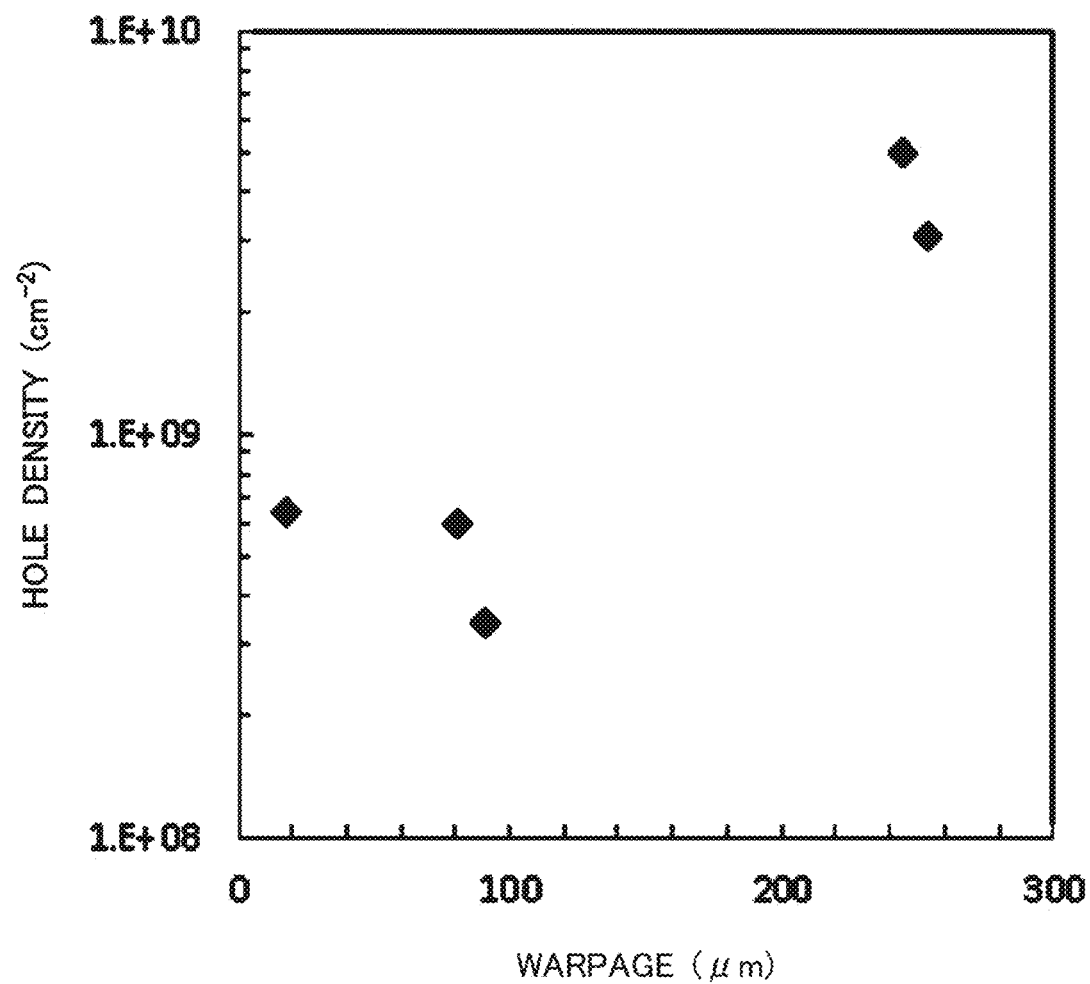
FIG. 13 is a graph showing how the warpage is related to the hole density.
Figure 14:
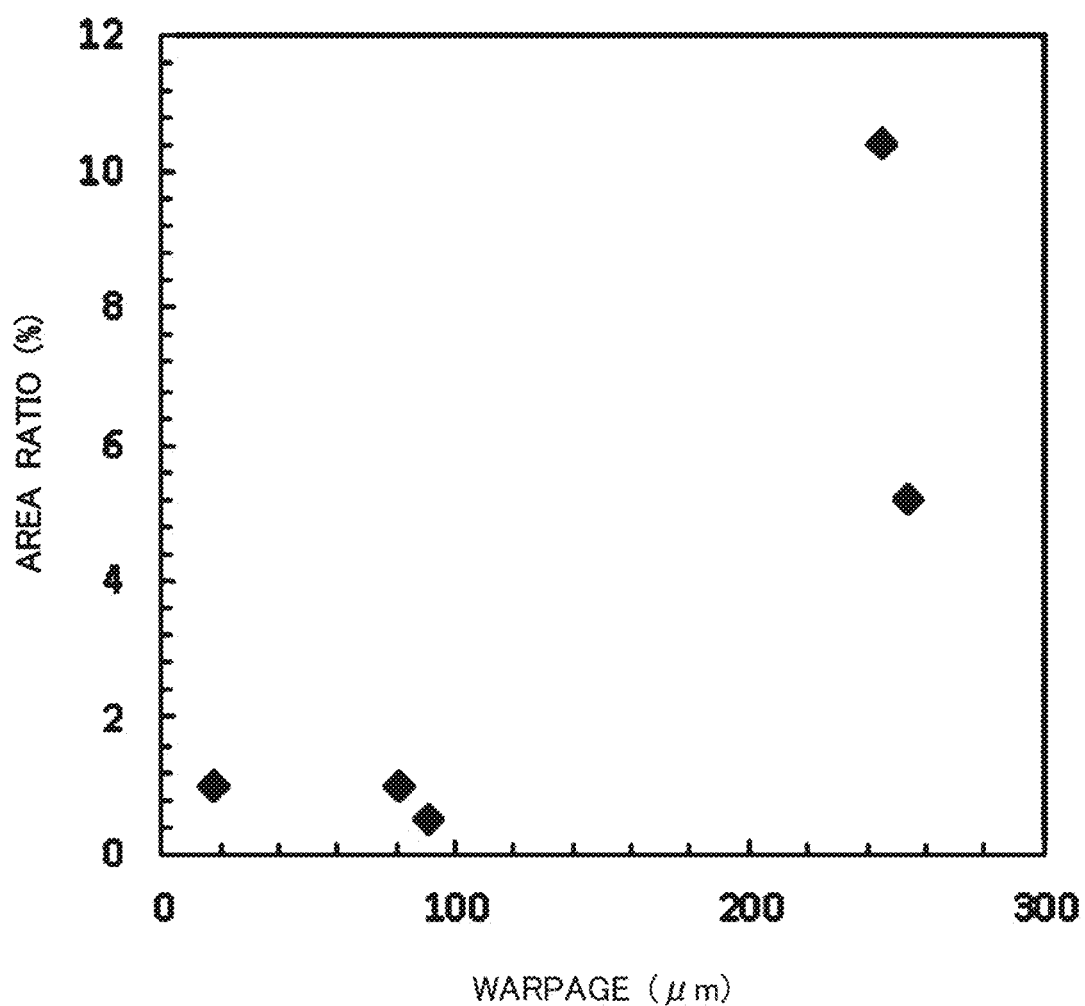
FIG. 14 is a graph showing how the warpage is related to the area ratio.

FIG. 13 is a graph showing how the warpage is related to the hole density, and FIG. 14 is a graph showing how the warpage is related to the area ratio. The graphs indicate that the warping is small when the hole density is $1\times10^8/cm^2$ or more and $1\times10^9/cm^2$ or less, and that the warping is small when the ratio of the hole area to the entire area (the area ratio) is 4% or less.

THIRD WORKING EXAMPLE

Like in the second working example, the reaction suppressing layer 104, the intermediate layer 110, the stress generating layer 106, the active layer 108 and the Schottky layer 112 were formed on the silicon wafer 102.

Figure 15:
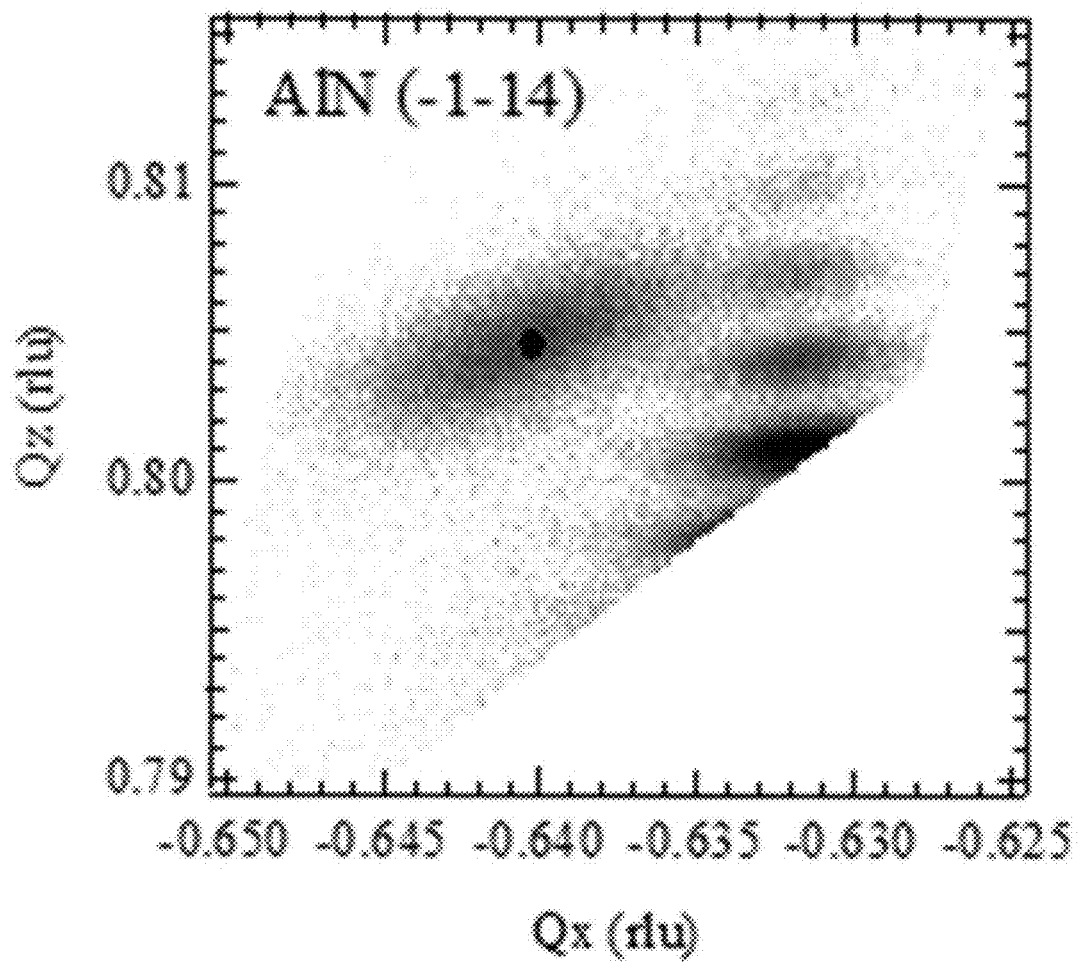
FIG. 15 shows the results of X-ray reciprocal space mapping of the diffraction plane (-1-14).

FIG. 15 shows the results of X-ray reciprocal space mapping of the diffraction plane (-1-14) of the semiconductor wafer and presents the peak of the X-ray reciprocal space plane of the reaction suppressing layer 104. The peak of the reaction suppressing layer 104 is indicated by the black point in the drawing. The position of the peak (the black point) of the reaction suppressing layer 104 can indicate the Qz and Qx values. Here, Qz indicates the c-axis length and Qx indicates the a-axis length. As for the semiconductor wafer of the third working example, changes in the pre-treatment conditions performed prior to the formation of the reaction suppressing layer 104 result in changes in the warpage of the wafer (see FIG. 12), like the semiconductor wafer of the second working example. Here, the position of the peak top of the reaction suppressing layer 104 in the X-ray reciprocal space plane (Qx-Qz plane) is shifted depending on the value of the warpage.

Figure 16:
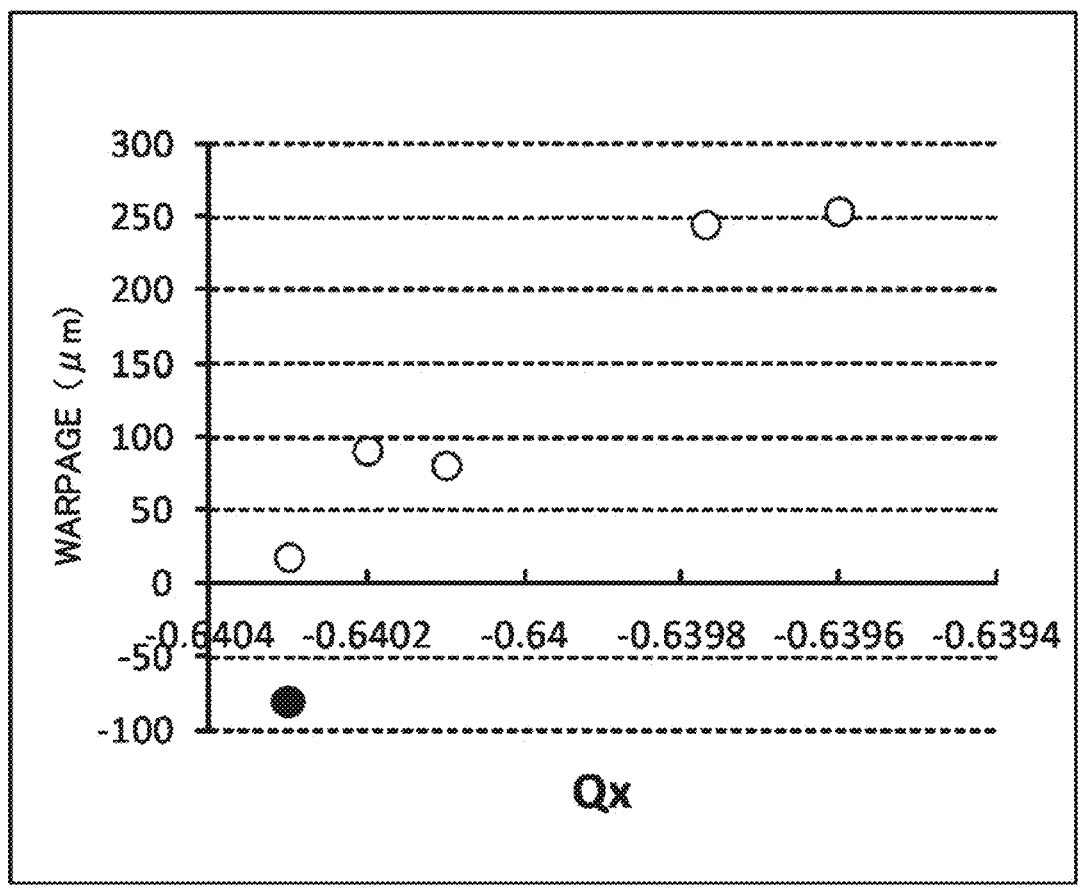
FIG. 16 is a graph showing how the warpage is related to Qx.

FIG. 16 is a graph showing how the warpage is related to Qx. The graph indicates that the warping increases as the Qx value increases. The graph specifically indicates that the value of the warping falls within an appropriate range when the AN layer serving as the reaction suppressing layer 104 has a Qx value of more than −0.6427 and less than −0.63977.

Figure 17:
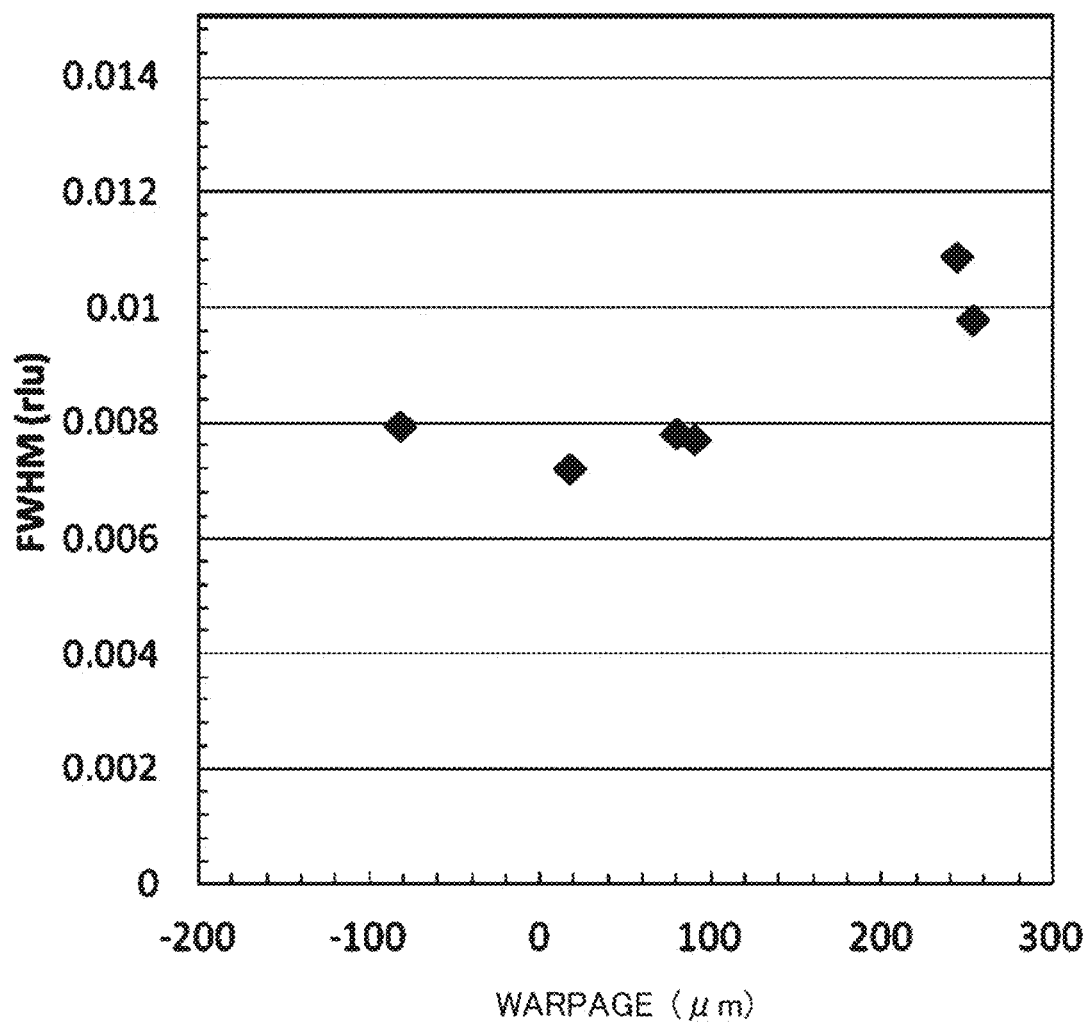
FIG. 17 is a graph showing how the warpage is related to the X-ray peak half width.

FIG. 17 is a graph showing how the warpage is related to the X-ray peak half width. The graph indicates that the warping decreases as the X-ray peak half width decreases.

FOURTH WORKING EXAMPLE

Under the same conditions as in the first working example, the reaction suppressing layer 104, the intermediate layer 110 and the stress generating layer 106 were formed on the silicon wafer 102. The depth profile of the carbon atom concentration was measured using secondary ion mass spectrometry (SIMS).

Figure 18:
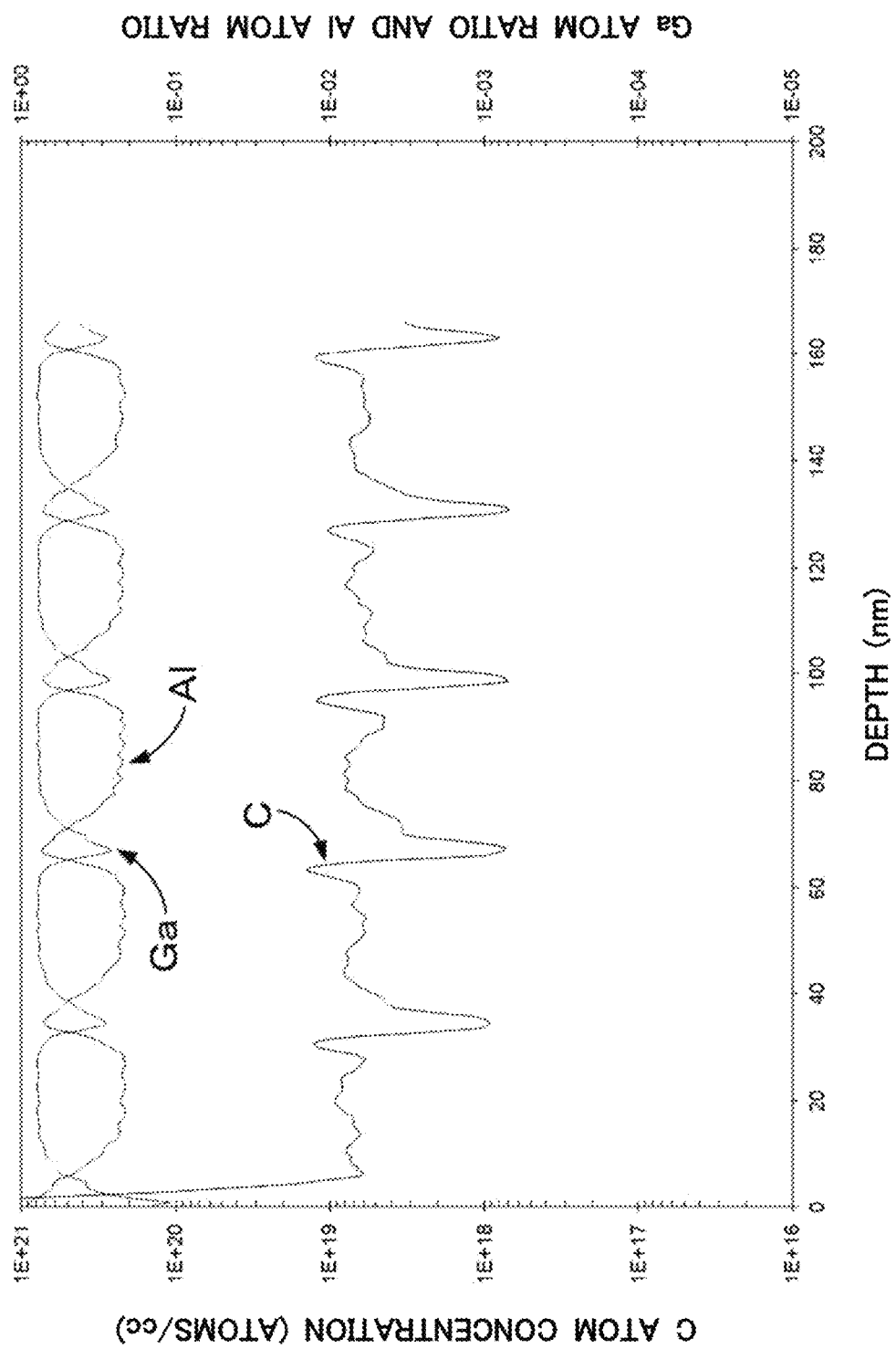
FIG. 18 is a graph showing the depth profile of a carbon atom concentration obtained by SIMS.

FIG. 18 is a graph showing the depth profile of the carbon atom concentration. In FIG. 18, the ratio of the Ga atoms to the Al atoms is also shown. The region with a high Al ratio is the first crystal layer 106a, and the region with a high Ga ratio is the second crystal layer 106b. As is apparent from FIG. 18, the carbon concentration is low in the first crystal layer 106a with a high Al ratio, and the carbon concentration is high in the second crystal layer 106b with a high Ga ratio. The carbon concentration in the first crystal layer 106a is $2\times10^{18}$ cm$^{-3}$ or less, or $1\times10^{18}$ cm$^{-3}$ or less at least in part of the first crystal layer 106a. The carbon concentration in the second crystal layer 106b is $1\times10^{18}$ cm$^{-3}$ or more, or $5\times10^{18}$ cm$^{-3}$ or more at least in part of the second crystal layer 106b.

FIFTH WORKING EXAMPLE

Under the same conditions as in the third exemplary experiment in the first working example, the reaction suppressing layer 104, the intermediate layer 110 and the stress generating layer 106 were formed on the silicon wafer 102. The depth profile of the carbon atom concentration was measured using secondary ion mass spectrometry (SIMS).

It has been found that the carbon concentration in the first crystal layer 106a does not reach or fall below $2\times10^{18}$ cm$^{-3}$ or less. When the carbon concentration in the first crystal layer 106a does not reach or fall below $2\times10^{18}$ cm$^{-3}$ or less, the resulting semiconductor wafer was characterized by large warpage and a withstand voltage of less than 600 V, as is apparent from the results of the third exemplary experiment. Stated differently, when the carbon concentration in the first crystal layer 106a is equal to or lower than $2\times10^{18}$ cm$^{-3}$, the resulting epi experiences small warpage 1and achieves sufficient withstand voltage.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor wafer including a silicon wafer and a nitride crystal layer on the silicon wafer, wherein
   the nitride crystal layer includes a reaction suppressing layer configured to suppress reaction between a silicon atom and a Group-III atom, a stress generating layer configured to generate compressive stress and an active layer in which an electronic element is to be formed,
   the reaction suppressing layer, the stress generating layer and the active layer are arranged in an order of the reaction suppressing layer, the stress generating layer and the active layer with the reaction suppressing layer being positioned the closest to the silicon wafer, and
   the stress generating layer includes:
   a first crystal layer having a bulk crystal lattice constant of a1, wherein the first crystal layer has a thickness of more than 5.0 nm and less than 10 nm and the first crystal layer has a portion that contains carbon atoms at a concentration of $1\times10^{18}$ cm$^{-3}$ or less; and
   a second crystal layer in contact with a surface of the first crystal layer that faces the active layer, the second crystal layer having a bulk crystal lattice constant of a2 (a1<a2), wherein the second crystal layer has a portion that contains carbon atoms at a concentration of $5\times10^{18}$ cm$^{-3}$ or more, and
   wherein the stress generating layer includes a plurality of two-layer stack structures each of which is made up by the first crystal layer and the second crystal layer.

2. The semiconductor wafer as set forth in claim 1, wherein
   the second crystal layer has a thickness of 10 nm or more and 300 nm or less.

3. The semiconductor wafer as set forth in claim 1, wherein the reaction suppressing layer has, on a surface thereof that faces the stress generating layer, holes each having an area of $7\times10^{-12}$ cm$^2$ or more at a density of $1\times10^8$ /cm$^2$ or more and $1\times10^9$ /cm$^2$ or less.

4. The semiconductor wafer as set forth in claim 3, wherein
a ratio of the area of the holes to an entire area included in the reaction suppressing layer is 4% or less.

5. The semiconductor wafer as set forth in claim 1, wherein
a Qx value of a diffraction plane (-1-14) of the reaction suppressing layer obtained by performing X-ray reciprocal space mapping on the nitride crystal layer is more than −0.6427 and less than −0.63977.

6. The semiconductor wafer as set forth in claim 5, wherein
a X-ray peak half width in reciprocal lattice coordinates of a crystal constituting the reaction suppressing layer falls within a range of 0.006 to 0.009 rlu (reciprocal lattice units).

7. The semiconductor wafer as set forth in claim 1, wherein
the first crystal layer is made of $Al_xGa_{1-x}N$ ($0.9 \leq x \leq 1$), and the second crystal layer is made of $Al_yGa_{1-y}N$ ($00 \leq y \leq 0.3$).

8. The semiconductor wafer as set forth in claim 1, wherein
the stress generating layer further includes a third crystal layer that is in contact with a surface of the second crystal layer that faces the active layer and has a bulk crystal lattice constant of a3 (a2<a3).

9. The semiconductor wafer as set forth in claim 1, wherein
the stress generating layer further includes a fourth crystal layer that is in contact with a surface of an n-th crystal layer that faces the active layer,
the n-th crystal layer is positioned closer to the active layer than the second crystal layer is, and
a bulk crystal lattice constant a4 of the fourth crystal layer is larger than a lattice constant of the n-th crystal layer.

10. The semiconductor wafer as set forth in claim 1, wherein
the stress generating layer further includes:
a fifth crystal layer that has a bulk crystal lattice constant of a5; and
a sixth crystal layer that is in contact with a surface of the fifth crystal layer that faces the active layer, the sixth crystal layer having a bulk crystal lattice constant of a6 (a5<a6).

11. The semiconductor wafer as set forth in claim 1, wherein
the nitride crystal layer further includes an intermediate layer between the reaction suppressing layer and the stress generating layer, the intermediate layer being in contact with the reaction suppressing layer and having a larger bulk crystal lattice constant than the reaction suppressing layer.

12. The semiconductor wafer as set forth in claim 1, wherein
the nitride crystal layer has a thickness of 500 nm or more and 13000 nm or less.

13. The semiconductor wafer as set forth in claim 1, wherein
the stress generating layer contains carbon atoms at a concentration of $1\times10^{19}$ cm$^{-3}$ or more.

14. The semiconductor wafer as set forth in claim 1, wherein
the reaction suppressing layer has a thickness of 30 nm or more and 300 nm or less,
the silicon wafer has a thickness of 400 μm or more, and
the silicon wafer has a diameter of 100 mm or more.

15. The semiconductor wafer as set forth in claim 1, wherein
the active layer has a mirror-finish surface.

* * * * *